US012587194B2

(12) United States Patent
Inoue et al.

(10) Patent No.: US 12,587,194 B2
(45) Date of Patent: Mar. 24, 2026

(54) CAPACITIVE BUTTON

(71) Applicant: Mitsubishi Electric Corporation, Tokyo (JP)

(72) Inventors: Takuya Inoue, Tokyo (JP); Takeshi Yamazaki, Tokyo (JP); Tae Orita, Tokyo (JP); Takeshi Ono, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 215 days.

(21) Appl. No.: 18/286,772

(22) PCT Filed: May 6, 2021

(86) PCT No.: PCT/JP2021/017362
§ 371 (c)(1),
(2) Date: Oct. 13, 2023

(87) PCT Pub. No.: WO2022/234616
PCT Pub. Date: Nov. 10, 2022

(65) Prior Publication Data
US 2024/0195415 A1    Jun. 13, 2024

(51) Int. Cl.
H03K 17/955 (2006.01)
H03K 17/96 (2006.01)
H03K 17/945 (2006.01)

(52) U.S. Cl.
CPC ......... H03K 17/955 (2013.01); H03K 17/962 (2013.01); *H03K 2017/9455* (2013.01);
(Continued)

(58) Field of Classification Search
CPC ............... H03K 17/955; H03K 17/962; H03K 2017/9455; H03K 2017/9604;
(Continued)

(56) References Cited

U.S. PATENT DOCUMENTS 5,235,217 A * 8/1993 Kirton ................ H03K 17/9532
307/328
2008/0007539 A1* 1/2008 Hotelling .............. G06F 3/0443
345/173
(Continued)

FOREIGN PATENT DOCUMENTS

JP       H05-135672 A      6/1993
JP       2013-077555 A      4/2013
(Continued)

OTHER PUBLICATIONS

International Search Report mailed on Jul. 27, 2021, received for PCT Application PCT/JP2021/017362, filed on May 6, 2021, 5 pages including English Translation.
(Continued)

*Primary Examiner* — Ahmed M Saeed
(74) *Attorney, Agent, or Firm* — XSENSUS LLP

(57) ABSTRACT

A capacitive button capable of improving tolerance to electrostatic discharge is provided. The capacitive button includes: a pair of sensor electrodes which are provided side by side; a floating electrode which is arranged on a front side of the pair of sensor electrodes via an insulating layer; and a ground electrode which is arranged so as to surround the floating electrode, and is grounded without being electrically connected with the pair of sensor electrodes and the floating electrode. By providing the configuration, the tolerance to the electrostatic discharge of the capacitive button can be improved.

10 Claims, 34 Drawing Sheets

(52) U.S. Cl.
 CPC ................ *H03K 2017/9604* (2013.01); *H03K 2217/0081* (2013.01); *H03K 2217/96077* (2013.01)

(58) Field of Classification Search
 CPC . H03K 2217/0081; H03K 2217/96077; H03K 2217/960705; H03K 2217/960785; H03K 17/9622; H01H 36/00; H01H 89/00
 See application file for complete search history.

(56) References Cited

U.S. PATENT DOCUMENTS

| | | | | |
|---|---|---|---|---|
| 2009/0001074 | A1* | 1/2009 | Shirokawa | ............. H05B 6/685 |
| | | | | 219/721 |
| 2009/0033343 | A1 | 2/2009 | Reynolds et al. | |

| | | | | |
|---|---|---|---|---|
| 2013/0062182 | A1 | 3/2013 | Tokura et al. | |
| 2019/0064956 | A1 | 2/2019 | Tanemura et al. | |
| 2019/0267993 | A1 | 8/2019 | Sawada | |
| 2019/0346288 | A1* | 11/2019 | Roziere | ............... G01D 5/2405 |

FOREIGN PATENT DOCUMENTS

| | | |
|---|---|---|
| JP | 2019-145484 A | 8/2019 |
| WO | 2022/234617 A1 | 11/2022 |

OTHER PUBLICATIONS

US Office Action issued Jan. 8, 2026, in the continuing U.S. Appl. No. 18/387,870, 31pp.

* cited by examiner

CHARGE : Q

Figure 22:
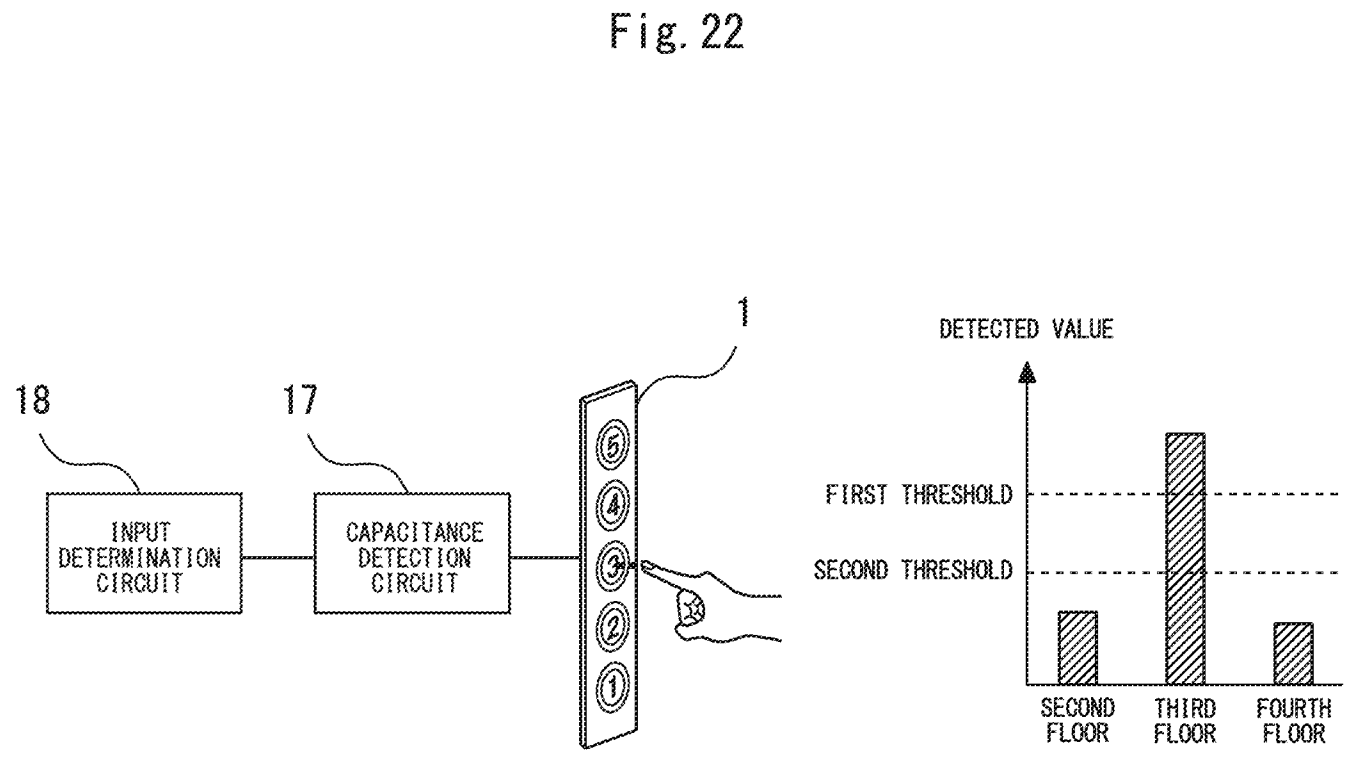

DETECTED VALUE

FIRST THRESHOLD

SECOND THRESHOLD

SECOND FLOOR

THIRD FLOOR

FOURTH FLOOR

1

17  CAPACITANCE DETECTION CIRCUIT

18  INPUT DETERMINATION CIRCUIT

Fig. 23
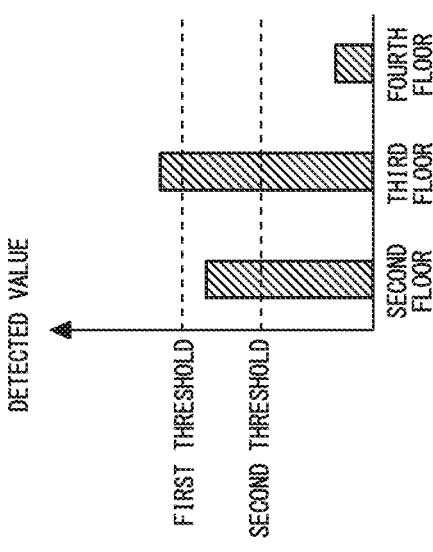
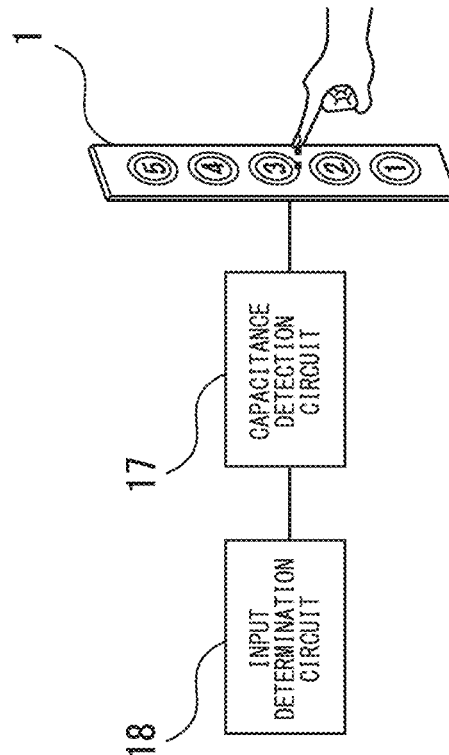

Fig. 26

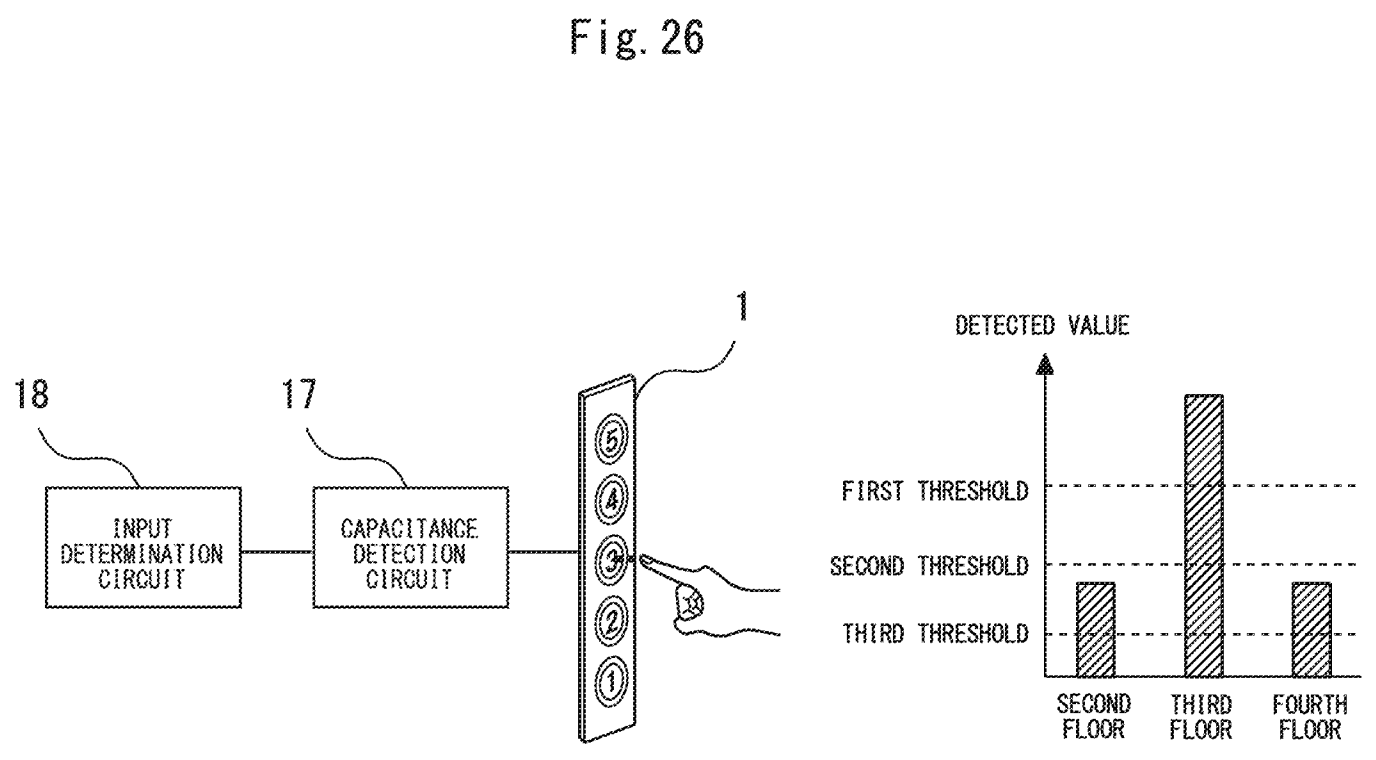

DETECTED VALUE

FIRST THRESHOLD

SECOND THRESHOLD

THIRD THRESHOLD

SECOND FLOOR

THIRD FLOOR

FOURTH FLOOR

1

17 CAPACITANCE DETECTION CIRCUIT

18 INPUT DETERMINATION CIRCUIT

Fig. 32

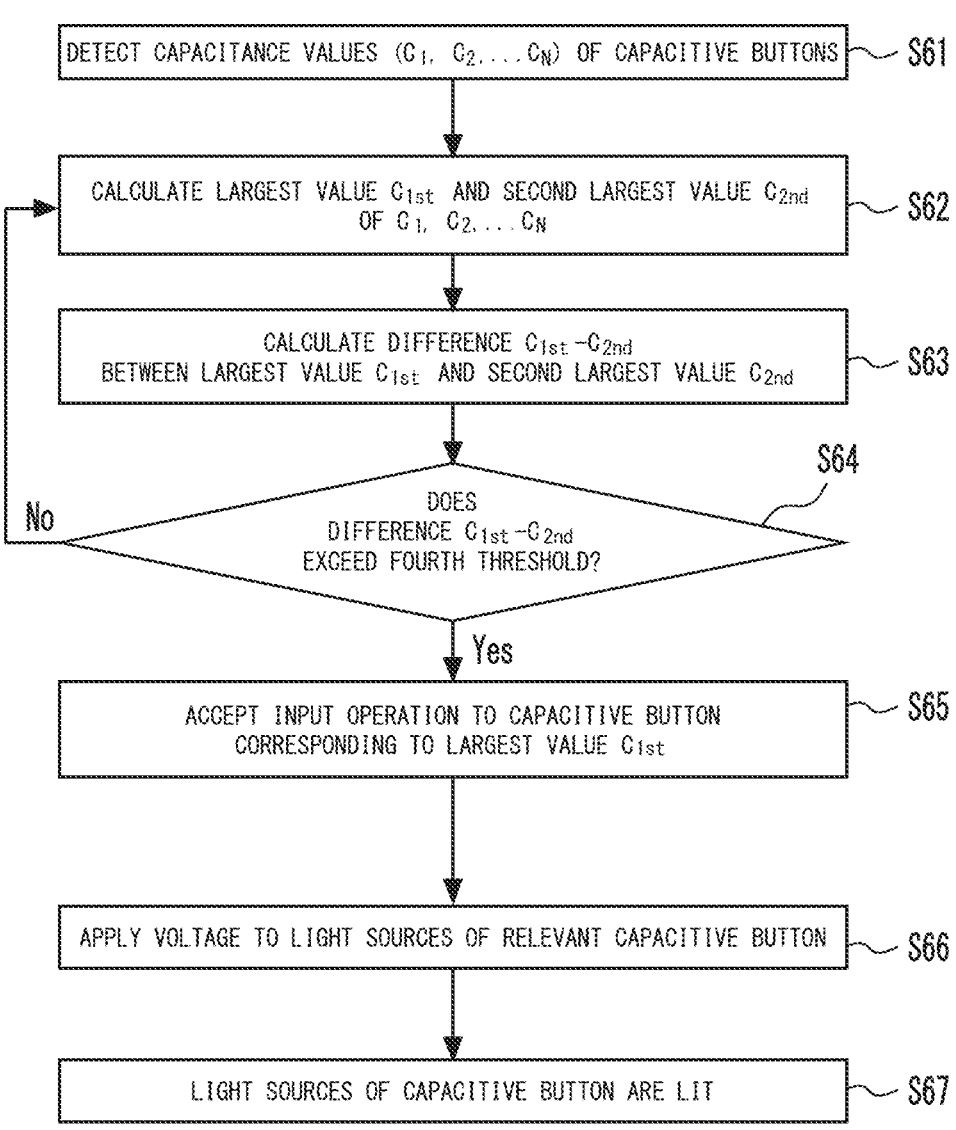

DETECT CAPACITANCE VALUES $(C_1, C_2, \ldots, C_N)$ OF CAPACITIVE BUTTONS — S61

CALCULATE LARGEST VALUE $C_{1st}$ AND SECOND LARGEST VALUE $C_{2nd}$ OF $C_1, C_2, \ldots, C_N$ — S62

CALCULATE DIFFERENCE $C_{1st} - C_{2nd}$ BETWEEN LARGEST VALUE $C_{1st}$ AND SECOND LARGEST VALUE $C_{2nd}$ — S63

S64
DOES DIFFERENCE $C_{1st} - C_{2nd}$ EXCEED FOURTH THRESHOLD?

No

Yes

ACCEPT INPUT OPERATION TO CAPACITIVE BUTTON CORRESPONDING TO LARGEST VALUE $C_{1st}$ — S65

APPLY VOLTAGE TO LIGHT SOURCES OF RELEVANT CAPACITIVE BUTTON — S66

LIGHT SOURCES OF CAPACITIVE BUTTON ARE LIT — S67

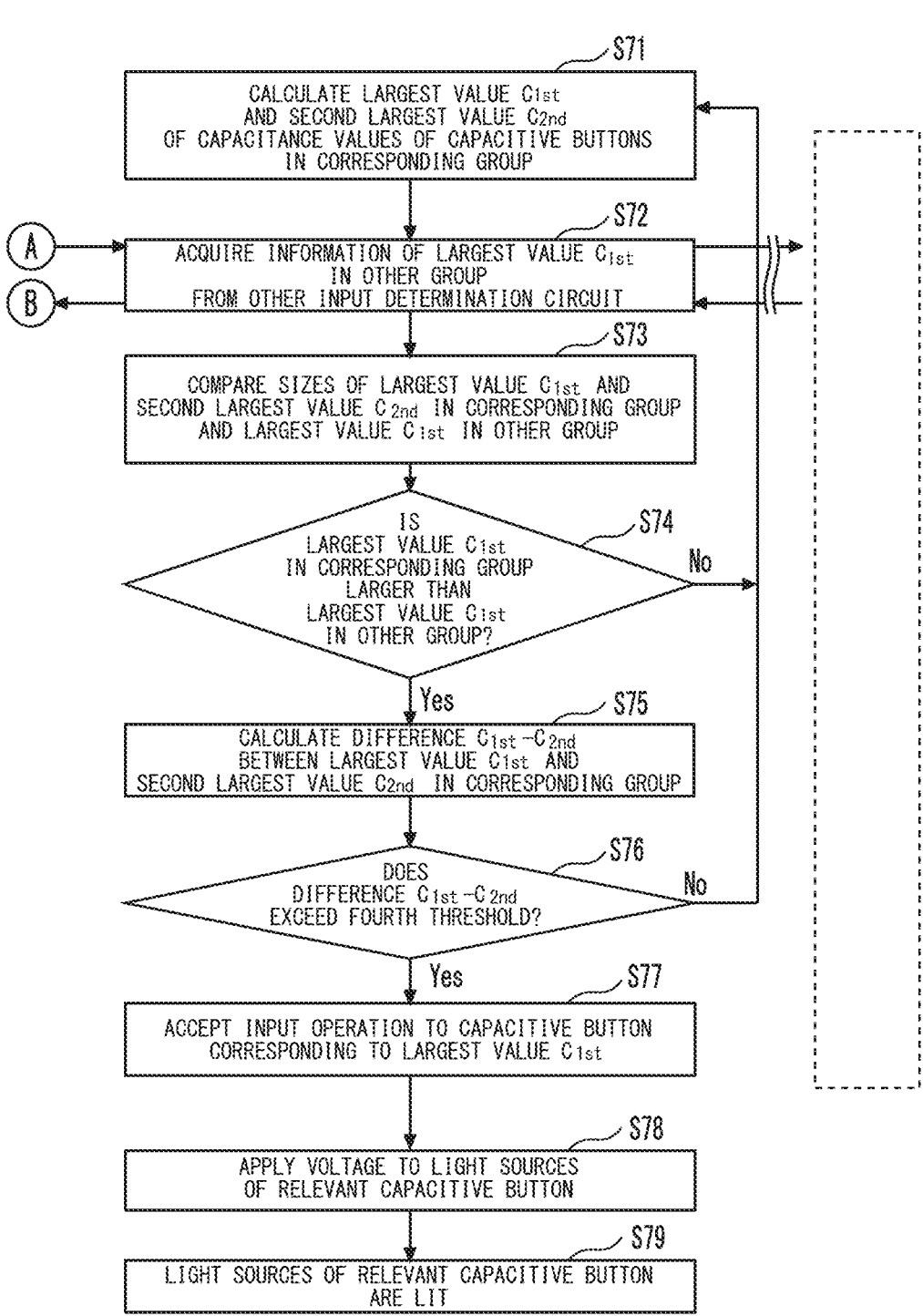

S71
CALCULATE LARGEST VALUE C1st
AND SECOND LARGEST VALUE C2nd
OF CAPACITANCE VALUES OF CAPACITIVE BUTTONS
IN CORRESPONDING GROUP

Ⓐ
Ⓑ

S72
ACQUIRE INFORMATION OF LARGEST VALUE C1st
IN OTHER GROUP
FROM OTHER INPUT DETERMINATION CIRCUIT

S73
COMPARE SIZES OF LARGEST VALUE C1st AND
SECOND LARGEST VALUE C2nd IN CORRESPONDING GROUP
AND LARGEST VALUE C1st IN OTHER GROUP

S74
IS
LARGEST VALUE C1st
IN CORRESPONDING GROUP
LARGER THAN
LARGEST VALUE C1st
IN OTHER GROUP?          No

Yes          S75
CALCULATE DIFFERENCE C1st −C2nd
BETWEEN LARGEST VALUE C1st AND
SECOND LARGEST VALUE C2nd IN CORRESPONDING GROUP

S76
DOES
DIFFERENCE C1st −C2nd
EXCEED FOURTH THRESHOLD?          No

Yes          S77
ACCEPT INPUT OPERATION TO CAPACITIVE BUTTON
CORRESPONDING TO LARGEST VALUE C1st

S78
APPLY VOLTAGE TO LIGHT SOURCES
OF RELEVANT CAPACITIVE BUTTON

S79
LIGHT SOURCES OF RELEVANT CAPACITIVE BUTTON
ARE LIT

CAPACITIVE BUTTON

CROSS-REFERENCE TO RELATED APPLICATION

This application is based on PCT filing PCT/JP2021/017362, filed May 6, 2021, the entire contents of which are incorporated herein by reference.

TECHNICAL FIELD

The present disclosure relates to a capacitive button.

BACKGROUND ART

PTL 1 discloses a proximity sensor. According to the proximity sensor, miniaturization is possible.

PRIOR ART

Patent Literature

[PTL 1] JP H5-135672A

SUMMARY OF THE INVENTION

Problem to be Solved by the Invention

However, when the configuration of the proximity sensor described in PTL 1 is applied to a capacitive button, electrostatic discharge reaches a sensor electrode. Therefore, tolerance to the electrostatic discharge is insufficient.

The present disclosure is implemented in order to solve the problem described above. An object of the present disclosure is to provide a capacitive button capable of improving tolerance to electrostatic discharge.

Means to Solve the Problem

A capacitive button according to the present disclosure includes: a pair of sensor electrodes which are provided side by side; a floating electrode which is arranged on a front side of the pair of sensor electrodes via an insulating layer; and a ground electrode which is arranged so as to surround the floating electrode and is grounded without being electrically connected with the pair of sensor electrodes and the floating electrode.

A capacitive button according to the present disclosure includes: an operation accepting body which is formed of an insulator; a ground electrode which is arranged so as to surround the operation accepting body, and is grounded; and a pair of sensor electrodes which are arranged more on a back side than the operation accepting body, and are formed in a mesh shape.

Effects of the Invention

According to the present disclosure, in a first example, the ground electrode is arranged so as to surround the floating electrode. The ground electrode is grounded without being electrically connected with the pair of sensor electrodes and the floating electrode. In a second example, the pair of sensor electrodes are formed in the mesh shape. Therefore, the tolerance to electrostatic discharge of a capacitive button can be improved.

BRIEF DESCRIPTION OF DRAWINGS

FIG. 17 is a circuit diagram of the input device to which the capacitive button is applied in Embodiment 2.

FIG. 18 is a circuit diagram of the input device to which the capacitive button is applied in Embodiment 2.

FIG. 22 is a diagram for explaining a condition for accepting an input by an input device in Embodiment 4.

FIG. 23 is a diagram for explaining a condition for not accepting an input by the input device in Embodiment 4.

FIG. 26 is a diagram for explaining a condition for accepting an input by an input device in Embodiment 5

FIG. 32 is a flowchart for explaining operations of an input device in Embodiment 9.

FIG. 33 is a diagram for explaining a condition for determining an input by an input device in Embodiment 10.

FIG. 35 is a flowchart for explaining operations of the input device in Embodiment 10.

DESCRIPTION OF EMBODIMENTS

Embodiments will be explained according to the attached drawings. Note that, in each figure, the same signs are attached to the same or corresponding parts. Redundant explanation of the parts is appropriately simplified or omitted.

Embodiment 1

Figure 1:
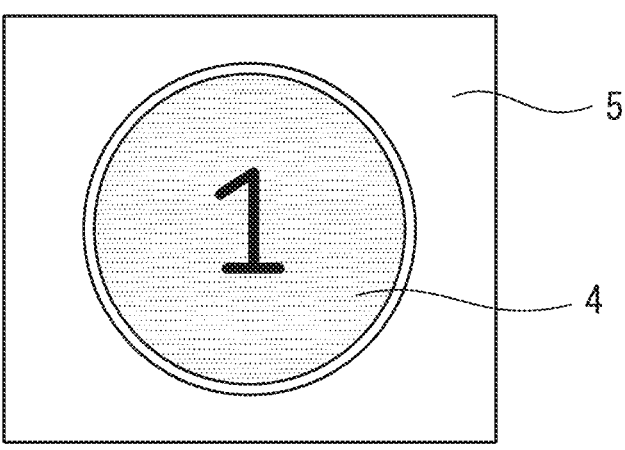
FIG. 1 is a front view of a capacitive button in Embodiment 1.
Figure 2:
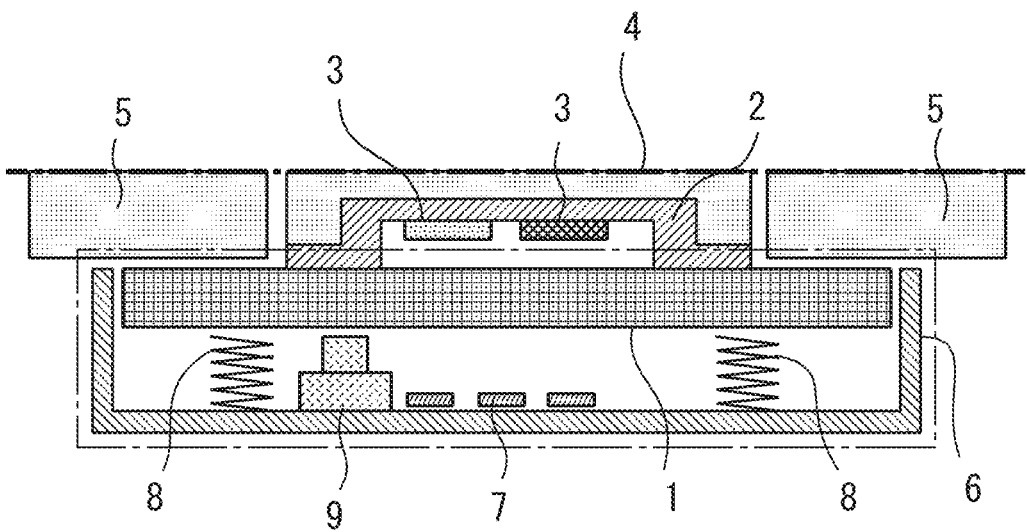
FIG. 2 is a sectional view of the capacitive button in Embodiment 1.
Figure 3:
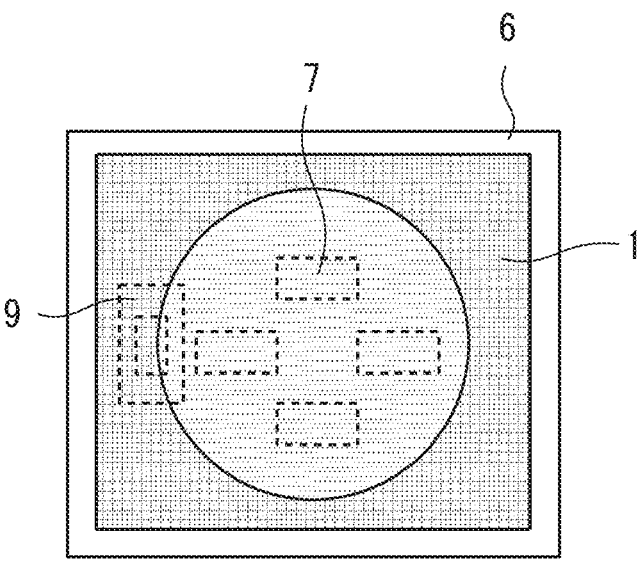
FIG. 3 is a front view of a main part of the capacitive button in Embodiment 1.

FIG. 1 is a front view of a capacitive button in Embodiment 1. FIG. 2 is a sectional view of the capacitive button in Embodiment 1. FIG. 3 is a front view of a main part of the capacitive button in Embodiment 1.

As illustrated in FIG. 1 to FIG. 3, the capacitive button includes a button holding plate 1, an insulator 2, a pair of sensor electrodes 3, a floating electrode 4, a ground electrode 5, a casing 6, a plurality of light sources 7, a plurality of springs 8, and a tactile switch 9.

For example, the button holding plate 1 is formed of a resin. For example, the button holding plate 1 is formed in a planar shape. For example, the insulator 2 is formed of a resin as an insulating layer. For example, the insulator 2 is formed in a box shape. The insulator 2 is held by the button holding plate 1.

The pair of sensor electrodes 3 are attached side by side to an inner surface of the insulator 2. The pair of sensor electrodes 3 are held by the button holding plate 1 via the insulator 2. One of the pair of sensor electrodes 3 is an electrode for transmission. The other one of the pair of sensor electrodes 3 is an electrode for reception. Capacitance of the sensor electrodes 3 is detected by a mutual capacitance system of performing detection by a change amount of the capacitance between the transmission electrode and the reception electrode.

The floating electrode 4 is arranged on a front side of the pair of electrodes via the insulator 2. The floating electrode 4 is held by the button holding plate 1 via the insulator 2.

The ground electrode 5 is arranged so as to surround the floating electrode 4. The ground electrode 5 is grounded without being electrically connected with the pair of electrodes and the floating electrode 4.

The casing 6 freely movably houses the button holding plate 1. For example, each of the plurality of light sources 7 is an LED. The plurality of light sources 7 are arranged side by side on a bottom surface of the casing 6 on a back side of the button holding plate 1. The plurality of light sources 7 are provided so as to emit light to the side of the button holding plate 1. The plurality of springs 8 are arranged between the button holding plate 1 and the bottom surface of the casing 6. The tactile switch 9 is arranged on the bottom surface of the casing 6. The tactile switch 9 is provide so as to be pressed when the button holding plate 1 is pressed from the front side to the back side.

Next, the pair of sensor electrodes 3 and the floating electrode 4 will be explained using FIG. 4 and FIG. 5.

Figure 4:
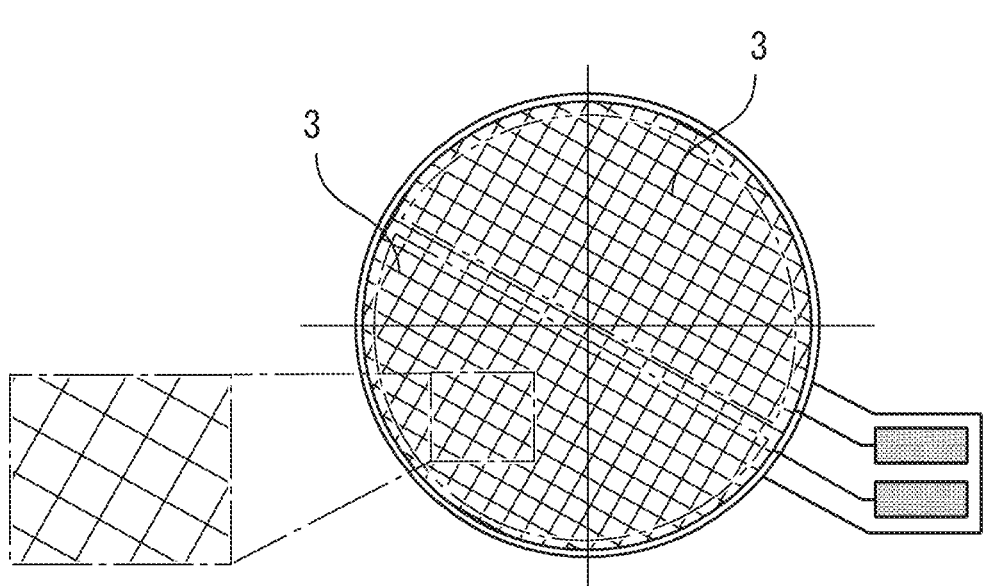
FIG. 4 is a front view of a pair of sensor electrodes of the capacitive button in Embodiment 1.

FIG. 4 is a front view of the pair of sensor electrodes of the capacitive button in Embodiment 1. FIG. 5 is a front view of the floating electrode and the ground electrode of the capacitive button in Embodiment 1.

As illustrated in FIG. 4, the pair of sensor electrodes 3 are each divided. The pair of sensor electrodes 3 are formed in a mesh shape formed of a metal material. Each of the pair of sensor electrodes 3 is formed so as to be a semicircle when viewed from the front. The pair of sensor electrodes 3 are formed so as to be circular together when viewed from the front. The pair of sensor electrodes 3 are formed such that an area when viewed from the front is an area set beforehand. When the sensor electrode is formed of a transparent conductive film such as an indium tin oxide alloy (ITO) or a conductive polymer such as poly (3,4-ethylene-dioxythiophene) (PEDOT), the mesh shape is not required.

Figure 5:
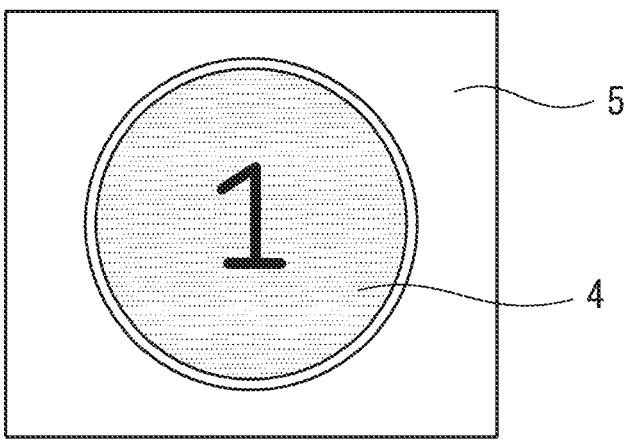
FIG. 5 is a front view of a floating electrode and a ground electrode of the capacitive button in Embodiment 1.

As illustrated in FIG. 5, the floating electrode 4 is formed so as to be circular when viewed from the front. The floating electrode 4 is formed such that an area when viewed from the front is an area corresponding to the area of the pair of sensor electrodes 3.

Here, the area of the floating electrode 4 in FIG. 5 and the area of a circle (the pair of sensor electrodes 3) on the inner side in FIG. 4 correspond to each other so as to be the almost same area.

In addition, the area of the pair of sensor electrodes 3 may be made larger than the area of the floating electrode 4.

Next, using FIG. 6A and FIG. 6B, an input operation to the capacitive button will be explained.

Figure 6A:
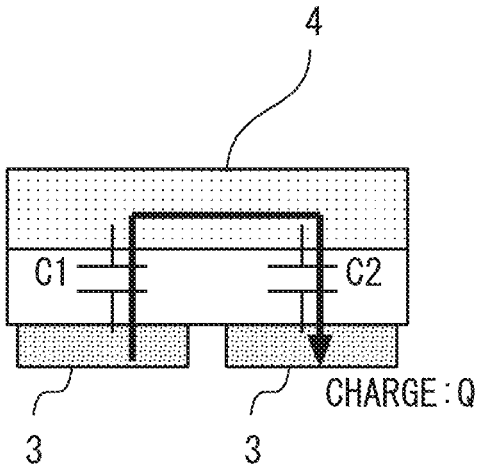
FIG. 6A and FIG. 6B are figures for explaining an input operation to the capacitive button in Embodiment 1.
Figure 6B:
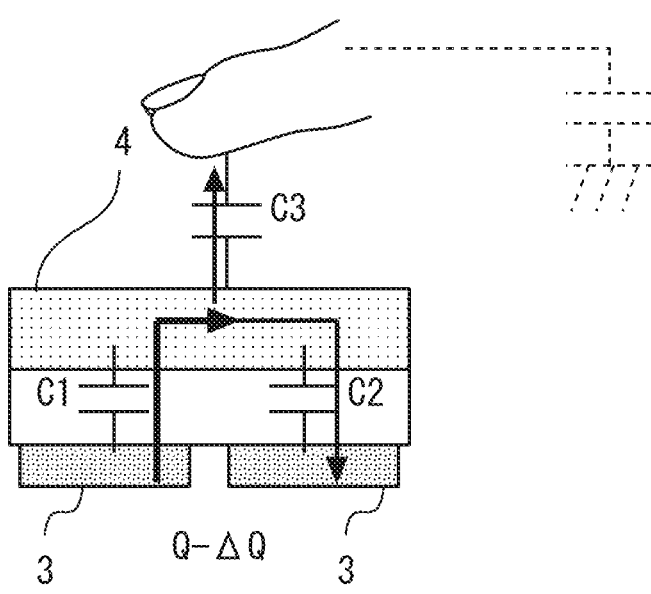

FIG. 6A and FIG. 6B are figures for explaining the input operation to the capacitive button in Embodiment 1.

As illustrated in FIG. 6A, the capacitance of one of the pair of sensor electrodes 3 is C1. The capacitance of the other one of the pair of sensor electrodes 3 is C2. C1 and C2 are the same value. In the state, a charge of the other one of the pair of sensor electrodes 3 is Q.

As illustrated in FIG. 6B, when a finger approaches the floating electrode 4, capacitance C3 is generated between the finger and the floating electrode 4. Therefore, the charge of the other one of the pair of sensor electrodes 3 is Q-ΔQ. The input operation to the capacitive button is detected based on a change of the charge at the time.

According to Embodiment 1 explained above, the ground electrode 5 is arranged so as to surround the floating electrode 4. The ground electrode 5 is grounded without being electrically connected with the pair of sensor electrodes 3 and the floating electrode 4. Therefore, capacitive coupling occurs between the floating electrode 4 and the ground electrode 5. As a result, tolerance to electrostatic discharge of the capacitive button can be improved. Further, the floating electrode 4 and the ground electrode 5 to be a design portion of the capacitive button can be formed of a same material. As a result, design of the capacitive button can be improved.

In addition, the pair of sensor electrodes 3 are each divided. The capacitance between each of the pair of sensor electrodes 3 and the floating electrode 4 is the same. Therefore, a detection performance of the pair of sensor electrodes 3 can be easily improved. At the time, as an open area of a mesh of the pair of sensor electrodes 3 is lowered, the detection performance of the pair of sensor electrodes 3 can be further improved.

Further, the area of the floating electrode 4 is the area corresponding to the area of the pair of sensor electrodes 3. Therefore, in the case of arranging the pair of sensor electrodes 3 inside the area of the floating electrode 4 when the floating electrode 4 is viewed from the front, the detection performance of the pair of sensor electrodes 3 can be more surely improved.

In addition, the tactile switch 9 is pressed when the button holding plate 1 is moved from the front side to the back side. Therefore, a function of a normal button can be added to the capacitive button. As a result, a function of the capacitive button and the function of a normal button can be realized at a low cost without widening an area required for the button. In particular, in the case of applying the capacitive button to a button for call registration of an elevator or the like, a configuration of functioning as the capacitive button within a range of a stroke of a normal button can be added. Therefore, the capacitive button can be realized without having restrictions on mounting such as a maximum stop number for a car of an elevator.

Embodiment 2

Figure 7:
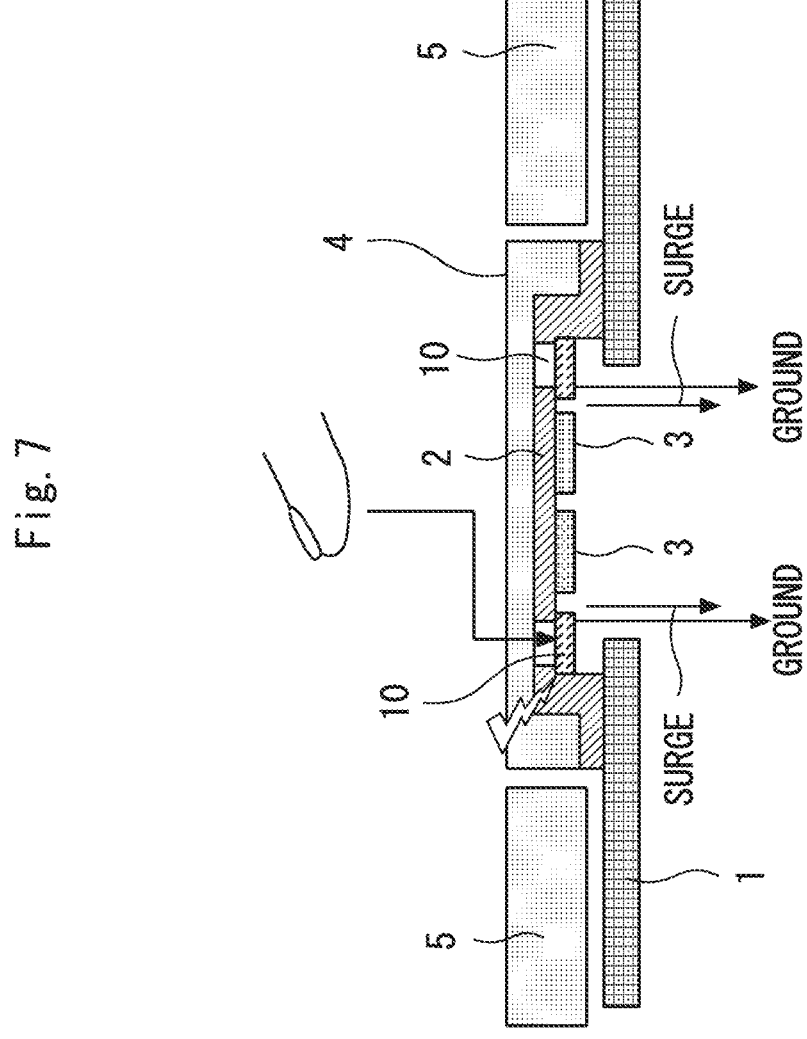
FIG. 7 is a sectional view of a main part of a capacitive button in Embodiment 2.
Figure 8:
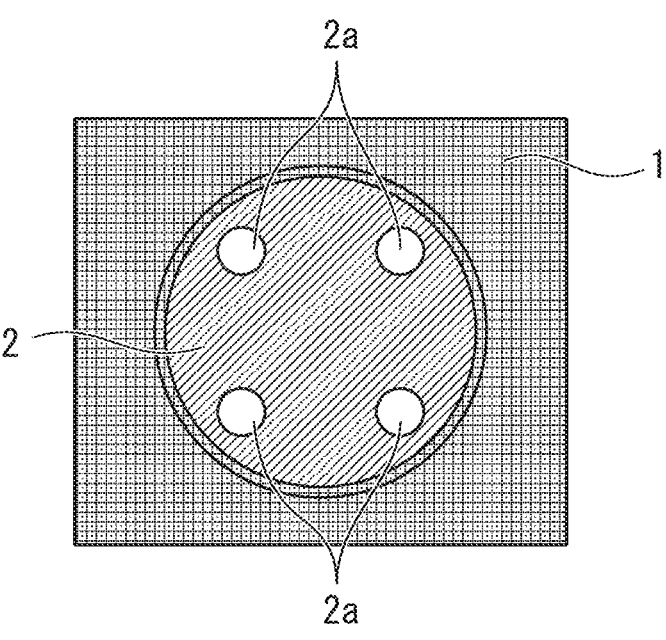
FIG. 8 is a front view of a button holding plate of the capacitive button in Embodiment 2.
Figure 9:
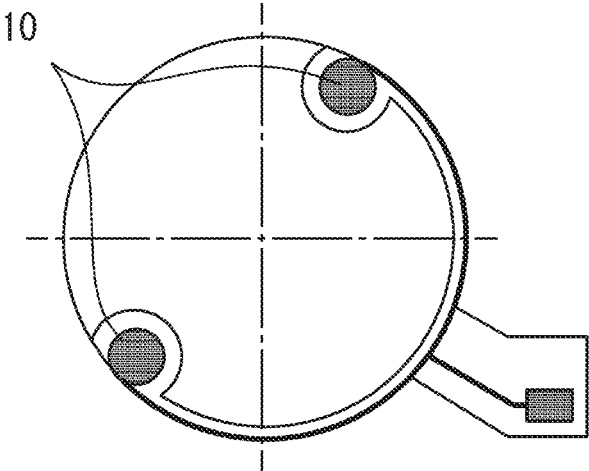
FIG. 9 is a front view of an antenna electrode of the capacitive button in Embodiment 2.

FIG. 7 is a sectional view of the main part of the capacitive button in Embodiment 2. FIG. 8 is a front view of a button holding plate of the capacitive button in Embodiment 2. FIG. 9 is a front view of an antenna electrode of the capacitive button in Embodiment 2. Note that the same signs are attached to the parts same as or corresponding to the parts of Embodiment 1. The explanation of the parts is omitted.

As illustrated in FIG. 7, an antenna electrode 10 is provided side by side with the pair of sensor electrodes 3 in a state of forming a gap with the floating electrode 4 more on the back side than the floating electrode 4. The antenna electrode 10 is provided more on the side of the ground electrode 5 than the pair of sensor electrodes 3. The antenna electrode 10 is grounded.

As illustrated in FIG. 8, four holes 2a are formed at a bottom part of the insulator 2. As illustrated in FIG. 9, the antenna electrode 10 is provided on a position to close the two holes 2a of the insulator 2. At least one hole 2a may be closed, and in order to provide redundancy of position accuracy at the time of assembly, the antenna electrode 10 may be provided on the position to close the plurality of holes 2a.

The antenna electrode 10 is provided side by side with the pair of sensor electrodes 3 on an opposed position across an air layer in the state of forming the gap with the floating electrode 4. The antenna electrode 10 is grounded. Since the sensor electrodes 3 face the floating electrode 4 across the insulator 2a dielectric constant of which is higher than that of the air layer, a discharge current generated at the floating electrode 4 flows not to the sensor electrodes 3 but to the antenna electrode 10. By forming the antenna electrode 10 by a low-resistance metal material and forming the antenna electrode 10 with a pattern width thicker than the sensor electrodes 3, resistance of the antenna electrode 10 is made lower than that of the sensor electrodes 3 and thus the discharge current more easily flows to the antenna electrode 10.

Next, using FIG. 10 and FIG. 11, an application example of the capacitive button will be explained.

Figure 10:
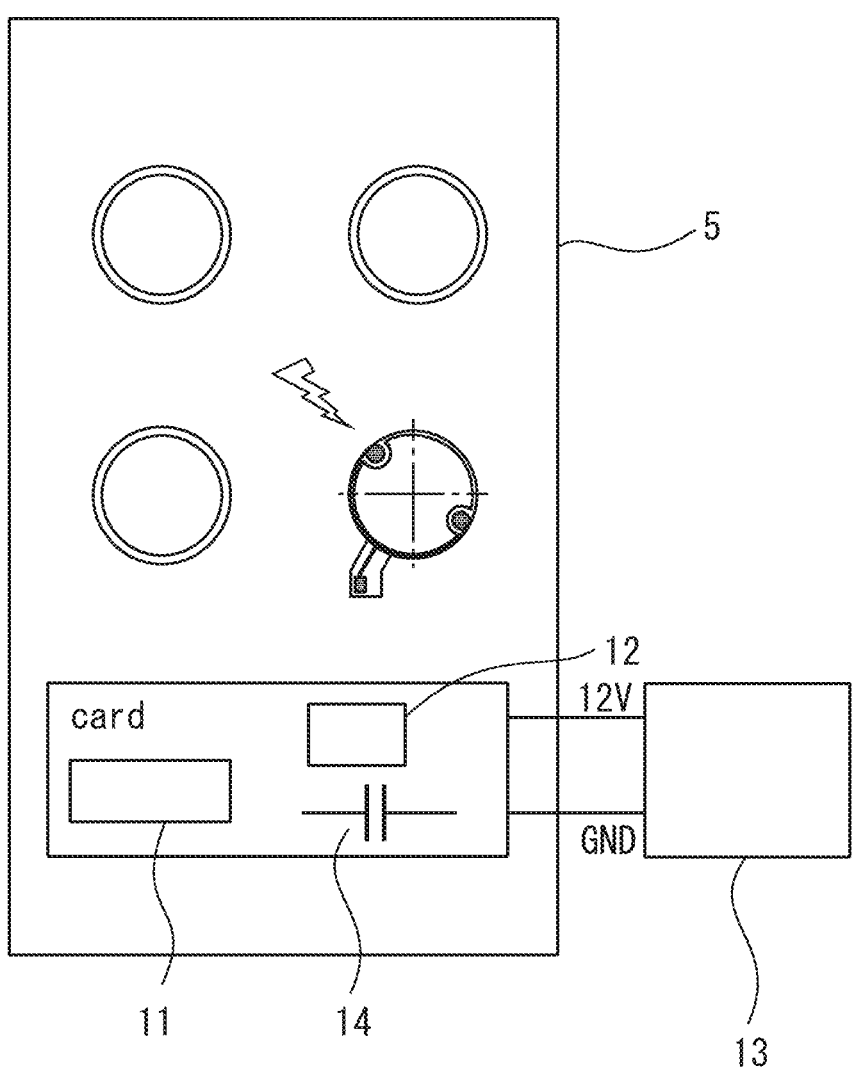
FIG. 10 is a configuration diagram of an input device to which the capacitive button is applied in Embodiment 2.

FIG. 10 is a configuration diagram of an input device to which the capacitive button is applied in Embodiment 2. FIG. 11 to FIG. 18 are circuit diagrams of the input device to which the capacitive button is applied in Embodiment 2.

As illustrated in FIG. 10, the input device includes the plurality of capacitive buttons, a microcomputer 11, a regulator 12, a regulated power supply 13 and a capacitor 14. At the time, for the plurality of capacitive buttons, a face plate is the ground electrode 5 in common.

FIG. 11 to FIG. 14 illustrate a method of reproducing electrostatic destruction of the button to which the pair of sensor electrodes 3 are connected.

Figure 11:
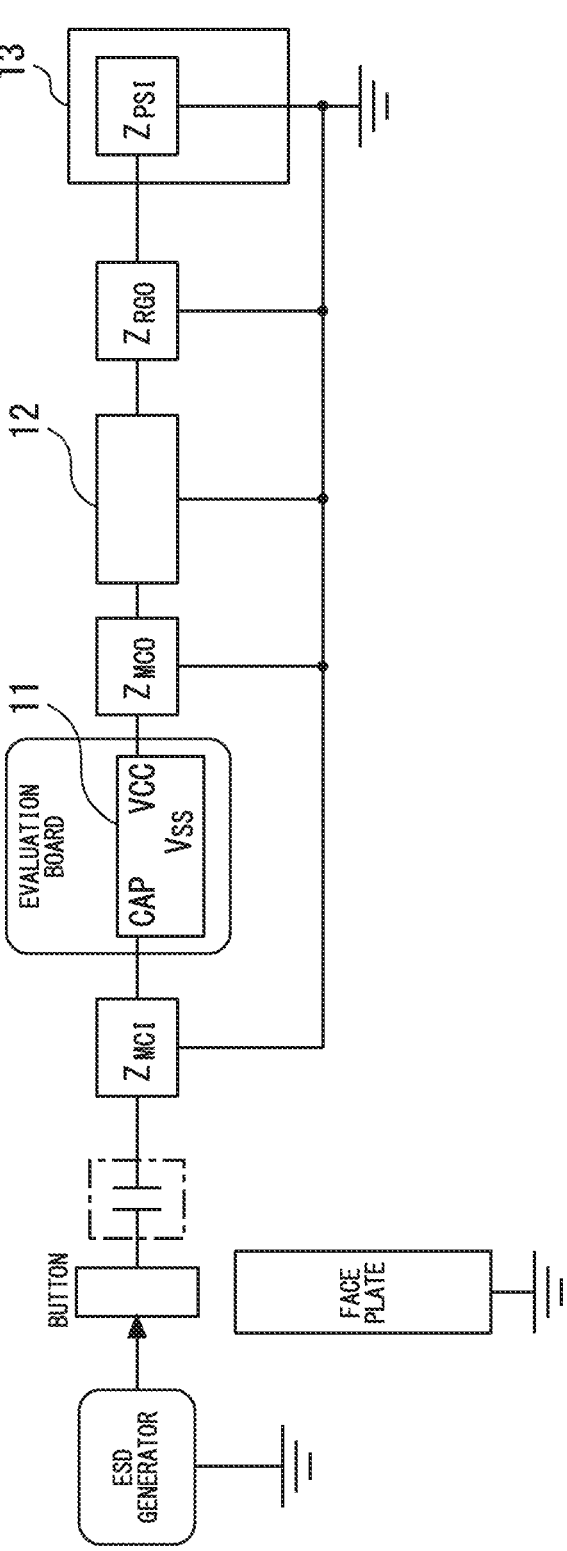
FIG. 11 is a circuit diagram of the input device to which the capacitive button is applied in Embodiment 2.

As illustrated in FIG. 11, an ESD (Electro-Static Discharge) generator (a device which simulates static electricity generation) is inputted to input CAP of the microcomputer 11 via the button and an impedance $Z_{MCI}$. Input is performed to the regulator 12 via an impedance $Z_{MCO}$ from a power supply VCC of the microcomputer 11.

Output of the regulator 12 is connected to the regulated power supply 13 via an impedance $Z_{RGO}$ The impedance $Z_{MCI}$ is configured by a capacitor, for example. The impedance $Z_{MCO}$ is grounded via a capacitor of 1 µF, for example. The impedance $Z_{RGO}$ is grounded via a capacitor of 0.1 µF, for example. These characteristic impedances $Z_{MCI}$, $Z_{MCO}$ and $Z_{RGO}$ are set so as to be electrically uniform.

Figure 12:
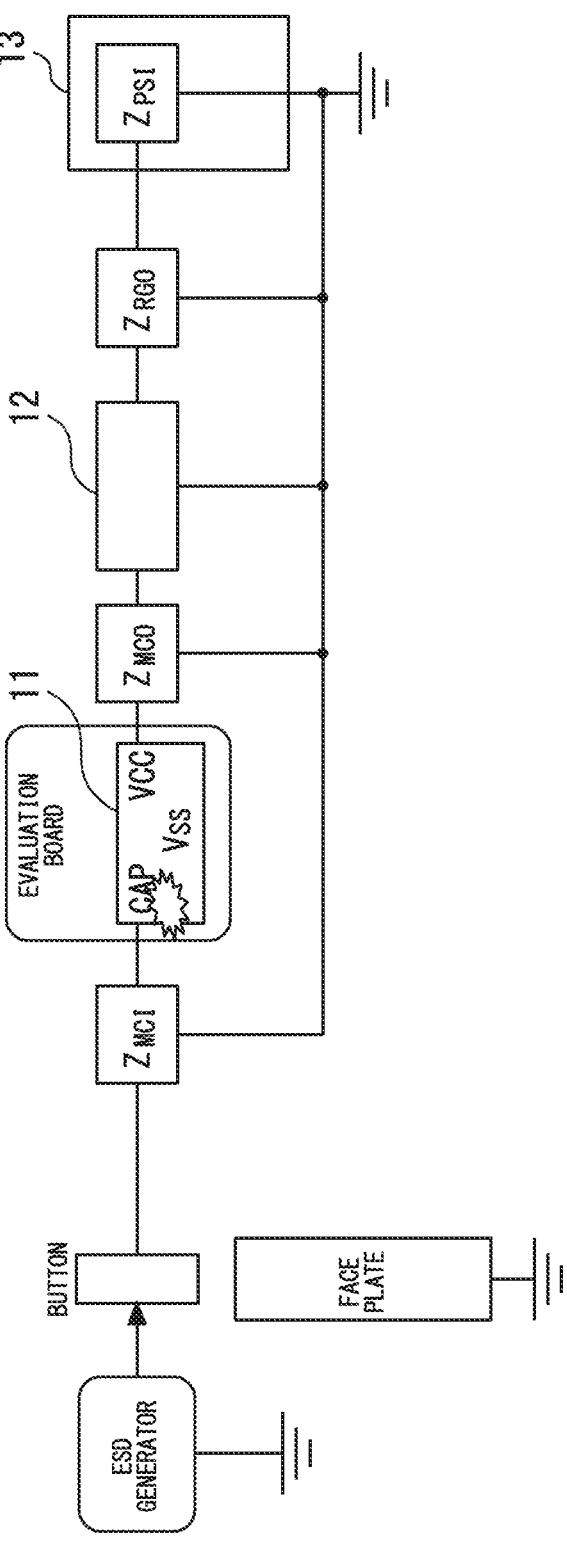
FIG. 12 is a circuit diagram of the input device to which the capacitive button is applied in Embodiment 2.

As illustrated in FIG. 12, in a reproduction experiment of a first destruction mode, the face plate is detached from the ESD generator and the button is connected. Static electricity outputted from the ESD generator is inputted via the button and the $Z_{MCI}$ to the input CAP of the microcomputer 11. In the state, contact discharge of the button to which the pair of sensor electrodes 3 are connected is performed.

Figure 13:
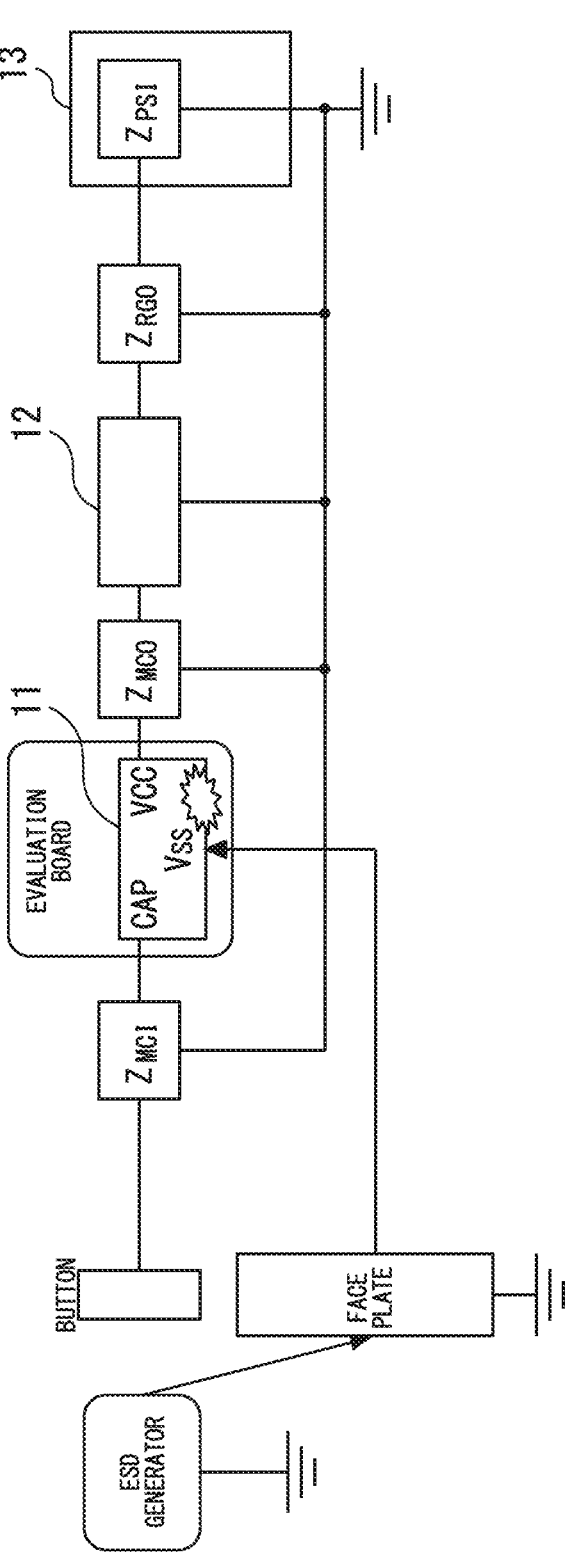
FIG. 13 is a circuit diagram of the input device to which the capacitive button is applied in Embodiment 2.

Next, as illustrated in FIG. 13, in the reproduction experiment of a second destruction mode, the button is detached from the ESD generator and the face plate is connected. The static electricity outputted from the ESD generator is applied via the face plate to a source side electrode $V_{SS}$ of the microcomputer 11. In the state, the contact discharge of the face plate is performed.

Figure 14:
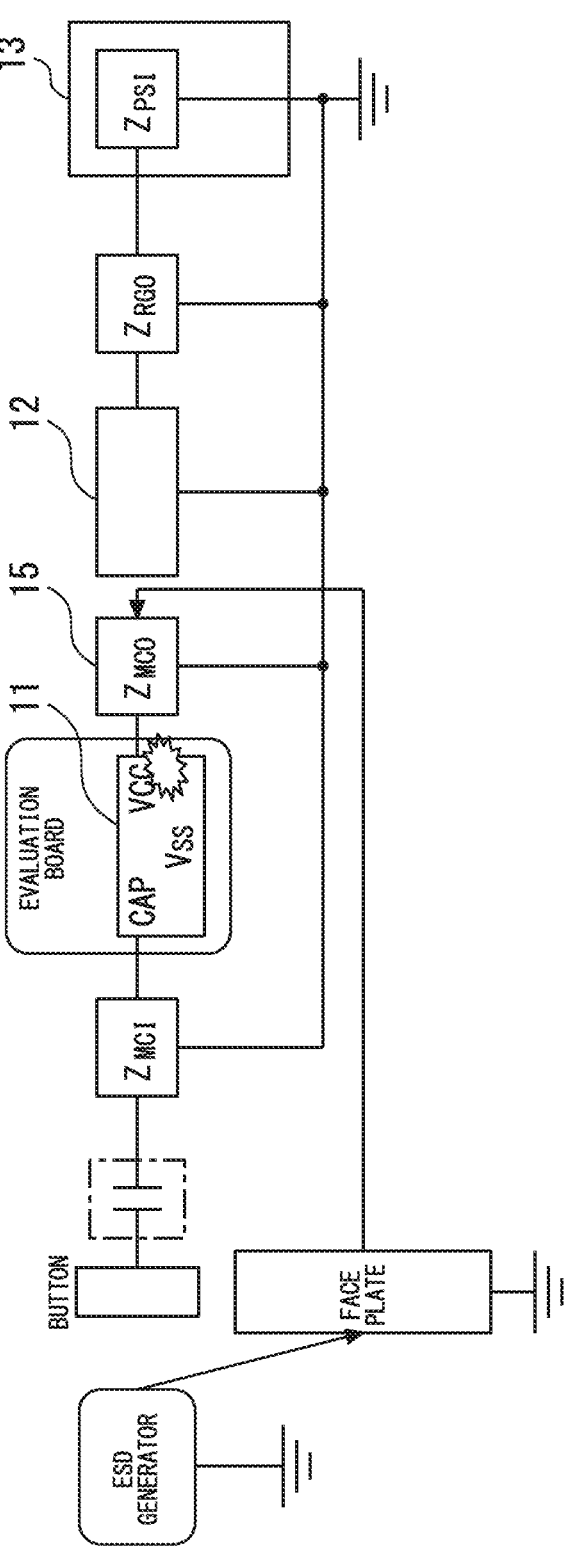
FIG. 14 is a circuit diagram of the input device to which the capacitive button is applied in Embodiment 2.

Next, as illustrated in FIG. 14, in the reproduction experiment of a third destruction mode, the static electricity outputted from the ESD generator is applied via the $Z_{MCO}$ to a collector power supply VCC of the microcomputer. Here, as the $Z_{MCO}$, a bypass capacitor 15 is connected between a power terminal of the microcomputer 11 and a ground terminal. The bypass capacitor 15 is 0.1 µF for example. In the state, the contact discharge of a surface of the face plate is performed.

FIG. 15 to FIG. 18 illustrate the method of reproducing the electrostatic destruction of the button to which the pair of sensor electrodes 3 are connected.

Figure 15:
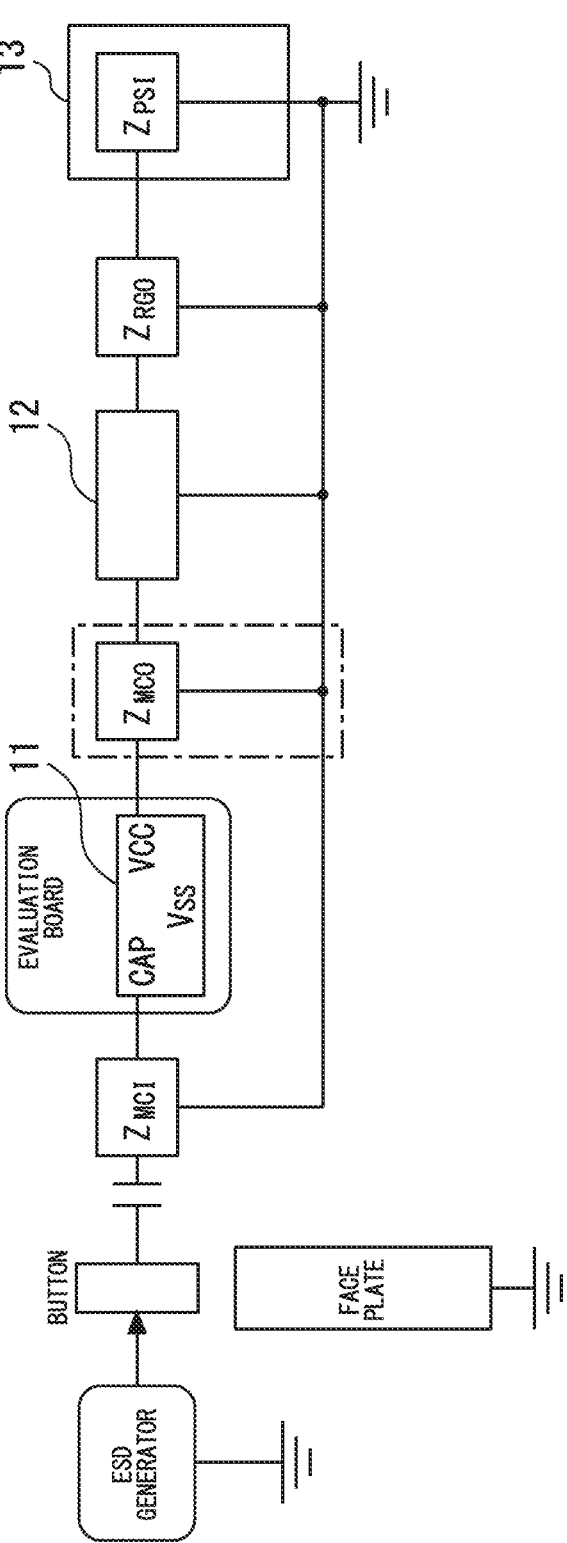
FIG. 15 is a circuit diagram of the input device to which the capacitive button is applied in Embodiment 2.

As illustrated in FIG. 15, the ESD generator is inputted to the input CAP of the microcomputer 11 via the button and the impedance $Z_{MCI}$. The input is performed to the regulator 12 via the impedance $Z_{MCO}$ from the power supply VCC of the microcomputer 11. The output of the regulator 12 is connected to the regulated power supply 13 via the impedance $Z_{RGO}$.

The impedance $Z_{MCI}$ is configured by a capacitor, for example. The impedance $Z_{MCO}$ is grounded via a capacitor of 1 µF, for example. The impedance $Z_{RGO}$ is grounded via a capacitor of 0.1 µF, for example. These characteristic impedances $Z_{MCI}$, $Z_{MCO}$ and $Z_{RGO}$ are set so as to be electrically uniform.

Figure 16:
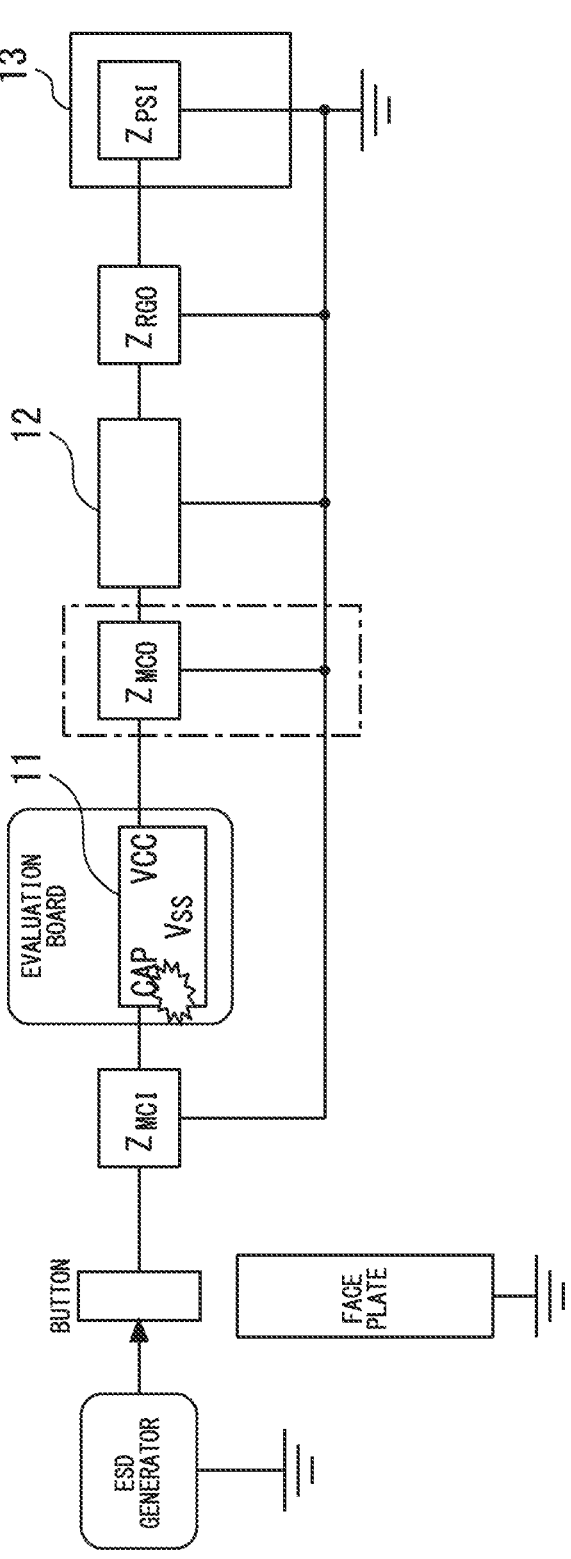
FIG. 16 is a circuit diagram of the input device to which the capacitive button is applied in Embodiment 2.

As illustrated in FIG. 16, in the reproduction experiment of the first destruction mode, the face plate is detached from the ESD generator and the button is connected. The static electricity outputted from the ESD generator is inputted via the button and the $Z_{MCI}$ to the input CAP of the microcomputer 11. In the state, the contact discharge of the button to which the pair of sensor electrodes 3 are connected is performed.

Figure 17:
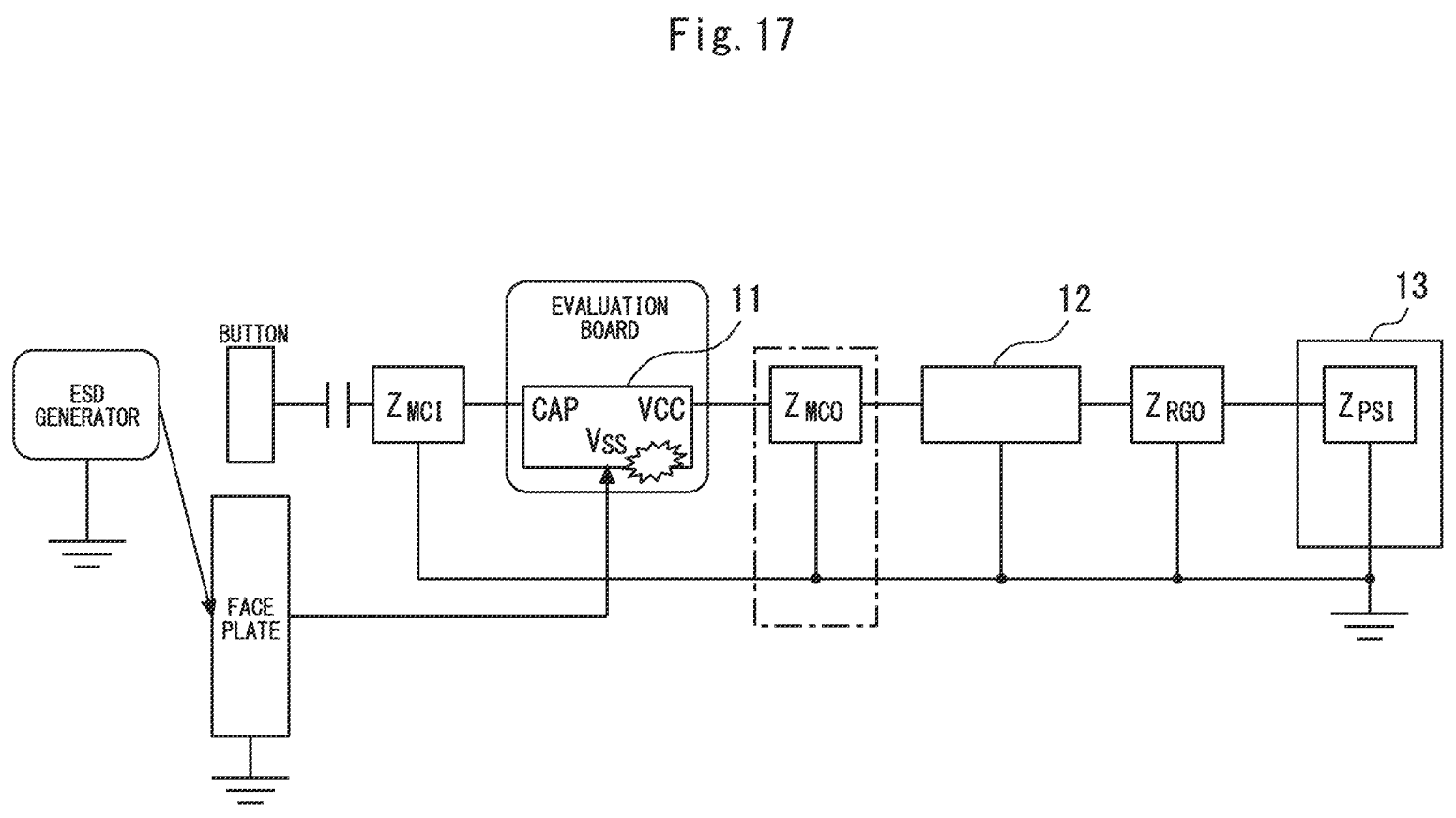

Next, as illustrated in FIG. 17, in the reproduction experiment of the second destruction mode, the button is detached from the ESD generator and the face plate is connected. The static electricity outputted from the ESD generator is applied via the face plate to the source side electrode $V_{SS}$ of the microcomputer 11. In the state, the contact discharge of the face plate is performed.

Figure 18:
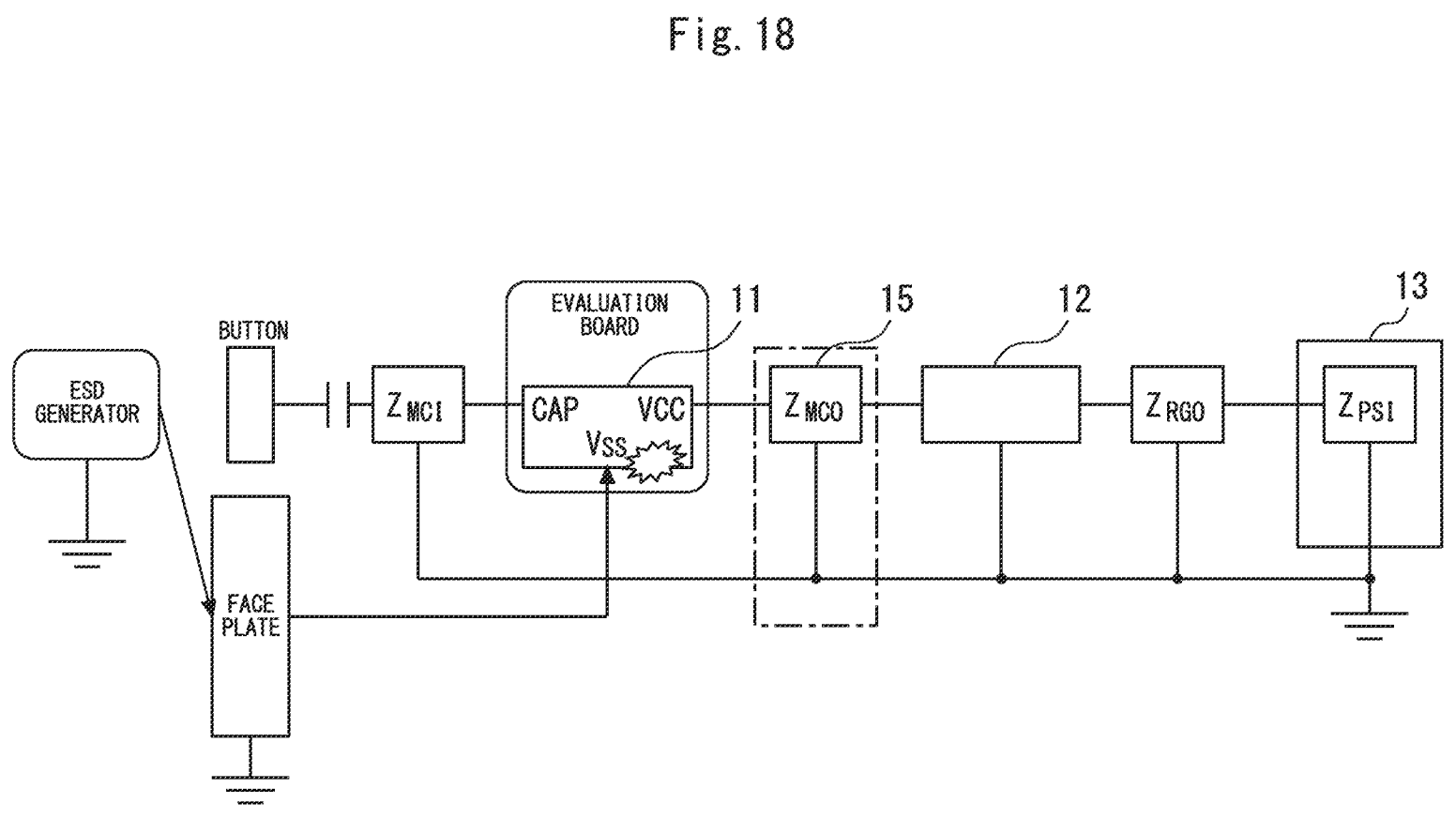

Next, as illustrated in FIG. 18, in the reproduction experiment of the third destruction mode, the static electricity outputted from the ESD generator is applied via the $Z_{MCO}$ to the collector power supply VCC of the microcomputer. Here, as the $Z_{MCO}$, the bypass capacitor 15 is connected between the power terminal of the microcomputer and the ground terminal. The bypass capacitor 15 is 0.1 μF for example. In the state, the contact discharge of the surface of the face plate is performed.

According to Embodiment 2 explained above, the antenna electrode 10 is provided side by side with the pair of sensor electrodes 3 in the state of forming the gap with the floating electrode 4. The antenna electrode 10 is grounded. Therefore, not only the tolerance to the electrostatic discharge of the capacitive button can be improved but also the tolerance to noise from outside can be improved. As a result, the detection performance of the pair of sensor electrodes 3 can be stabilized.

In addition, the pair of sensor electrodes 3 are connected to a circuit to which the microcomputer 11, the regulator 12 and the regulated power supply 13 are connected, via a resistor and a suppressor. The pair of sensor electrodes 3 are set such that the characteristic impedance is electrically uniform with the microcomputer 11, the regulator 12 and the regulated power supply 13. Therefore, generation of an overvoltage due to reflection which occurs when the characteristic impedance is different is suppressed, and destruction due to the overvoltage of the microcomputer 11 and the regulator 12 or the like can be prevented. As a result, the detection performance of the pair of sensor electrodes 3 can be stabilized.

Further, the pair of sensor electrodes 3 is connected to the circuit in the state where the power terminal of the microcomputer 11 is connected via the bypass capacitor 15 in the circuit to which the microcomputer 11, the regulator 12 and the regulated power supply 13 are connected. The pair of sensor electrodes 3 are set such that the characteristic impedance is electrically uniform with the microcomputer 11, the regulator 12 and the regulated power supply 13. Therefore, the generation of the overvoltage due to the reflection which occurs when the characteristic impedance is different is suppressed, and the destruction due to the overvoltage of the microcomputer 11 and the regulator 12 or the like can be prevented. As a result, the detection performance of the pair of sensor electrodes 3 can be stabilized.

Embodiment 3

Figure 19:
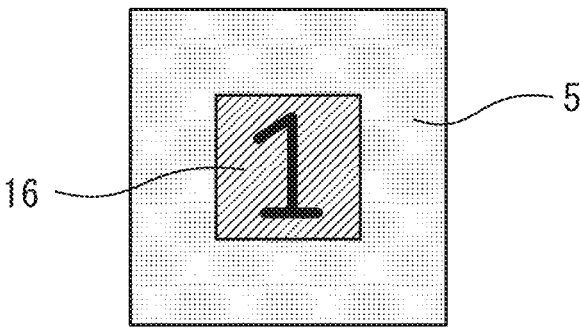
FIG. 19 is a front view of a capacitive button in Embodiment 3.
Figure 20:
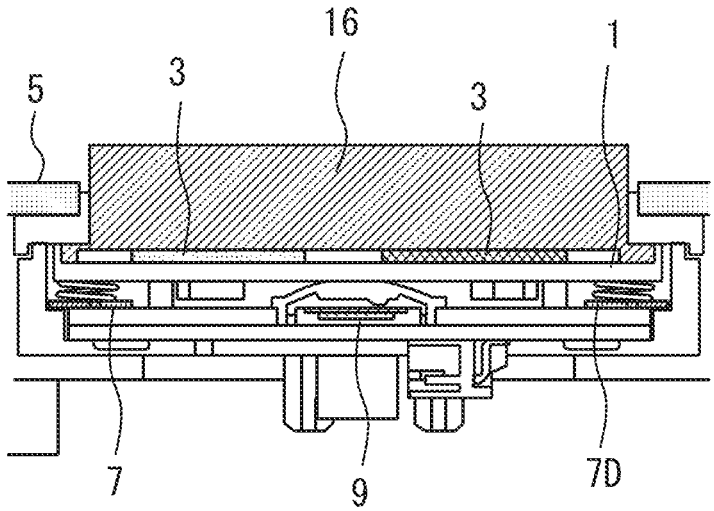
FIG. 20 is a sectional view of the capacitive button in Embodiment 3.
Figure 21:
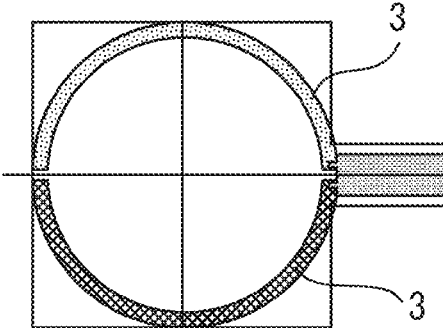
FIG. 21 is a front view of a pair of sensor electrodes of the capacitive button in Embodiment 3.

FIG. 19 is a front view of the capacitive button in Embodiment 3. FIG. 20 is a sectional view of the capacitive button in Embodiment 3. FIG. 21 is a front view of the pair of sensor electrodes of the capacitive button in Embodiment 3. Note that the same signs are attached to the parts same as or corresponding to the parts of Embodiment 1. The explanation of the parts is omitted.

As illustrated in FIG. 19 and FIG. 20, in Embodiment 3, the capacitive button includes an operation accepting body 16 instead of the floating electrode 4. The operation accepting body 16 is formed of a resin.

In FIG. 21, the area of each of the pair of sensor electrodes 3 is variable. When the sensor electrode 3 is arranged surrounding an outer periphery more on the outer side than the operation accepting body 16 so as not to be visible when viewed from an operation surface of the operation accepting body 16, the sensor electrode 3 may be a non-light-transmissive metal material, or a light-transmissive material of either the transparent conductive film such as the indium tin oxide alloy (ITO) or the conductive polymer such as poly (3,4-ethylenedioxythiophene) (PEDOT), is not always required to be formed in the mesh shape, and may be in a solid shape without being formed in the mesh shape.

The sensor electrode 3 is made light transmissive by being formed in the mesh shape in the case of being arranged on the inner side of the operation accepting body 16 and also in the case of being formed of the non-light-transmissive metal material. When the sensor electrode 3 is formed of the light-transmissive material of either the transparent conductive film such as the indium tin oxide alloy (ITO) or the conductive polymer such as poly (3,4-ethylenedioxythiophene) (PEDOT), the sensor electrode 3 is not always required to be formed in the mesh shape, and may be in the solid shape without being formed in the mesh shape. By forming the sensor electrode 3 in the mesh shape or in an irregular pattern shape, a boundary of an electrode pattern of the sensor electrode 3 becomes vague. As a result, visibility of the electrode pattern is suppressed and luminance unevenness of transmission light is suppressed.

According to Embodiment 3 explained above, the pair of sensor electrodes 3 are formed in the mesh shape formed of the metal material. Therefore, the tolerance to the electrostatic discharge of the capacitive button can be improved. In the case of the metal material, by providing the sensor electrode 3 only on a boundary part of the ground electrode 5 and the operation accepting body 16, the sensor electrode 3 which is not in the mesh shape may be provided. In the case of the transparent conductive film, the electrode which is solid on an entire surface may be arranged.

Note that the area of the other one of the pair of sensor electrodes 3 may be made smaller than the area of one of the pair of sensor electrodes 3. In this case, the tolerance to the electrostatic discharge of the capacitive button can be further improved.

Embodiment 4

FIG. 22 is a diagram for explaining a condition for accepting the input by the input device in Embodiment 4. FIG. 23 is a diagram for explaining the condition for not accepting the input by the input device in Embodiment 4. Note that the same signs are attached to the parts same as or corresponding to the parts of Embodiment 1. The explanation of the parts is omitted.

As illustrated in FIG. 22, the input device includes the plurality of capacitive buttons, a capacitance detection circuit 17 and an input determination circuit 18.

For example, the plurality of capacitive buttons are provided side by side in a vertical direction.

The capacitance detection circuit 17 detects capacitance values of the pair of sensor electrodes 3 (not illustrated in FIG. 22) in the plurality of capacitive buttons.

When the capacitance value detected by the capacitance detection circuit 17 in a first button of the plurality of capacitive buttons exceeds a first threshold, the input determination circuit 18 determines whether or not to accept the input operation to the first button. For example, in the case where the capacitance value detected by the capacitance detection circuit 17 in a second button adjacent to the first button is smaller than a second threshold, the input determination circuit 18 accepts the input operation to the first button. For example, in the case where the capacitance value detected by the capacitance detection circuit 17 in the second button is equal to or larger than the second threshold, the input determination circuit 18 does not accept the input operation to the first button.

Specifically, in FIG. 22, the input determination circuit 18 accepts the input operation to the capacitive button corresponding to "third floor". In FIG. 23, the input determination circuit 18 does not accept the input operation to the capacitive button corresponding to "third floor".

Next, operations of the input device will be explained using FIG. 24.

Figure 24:
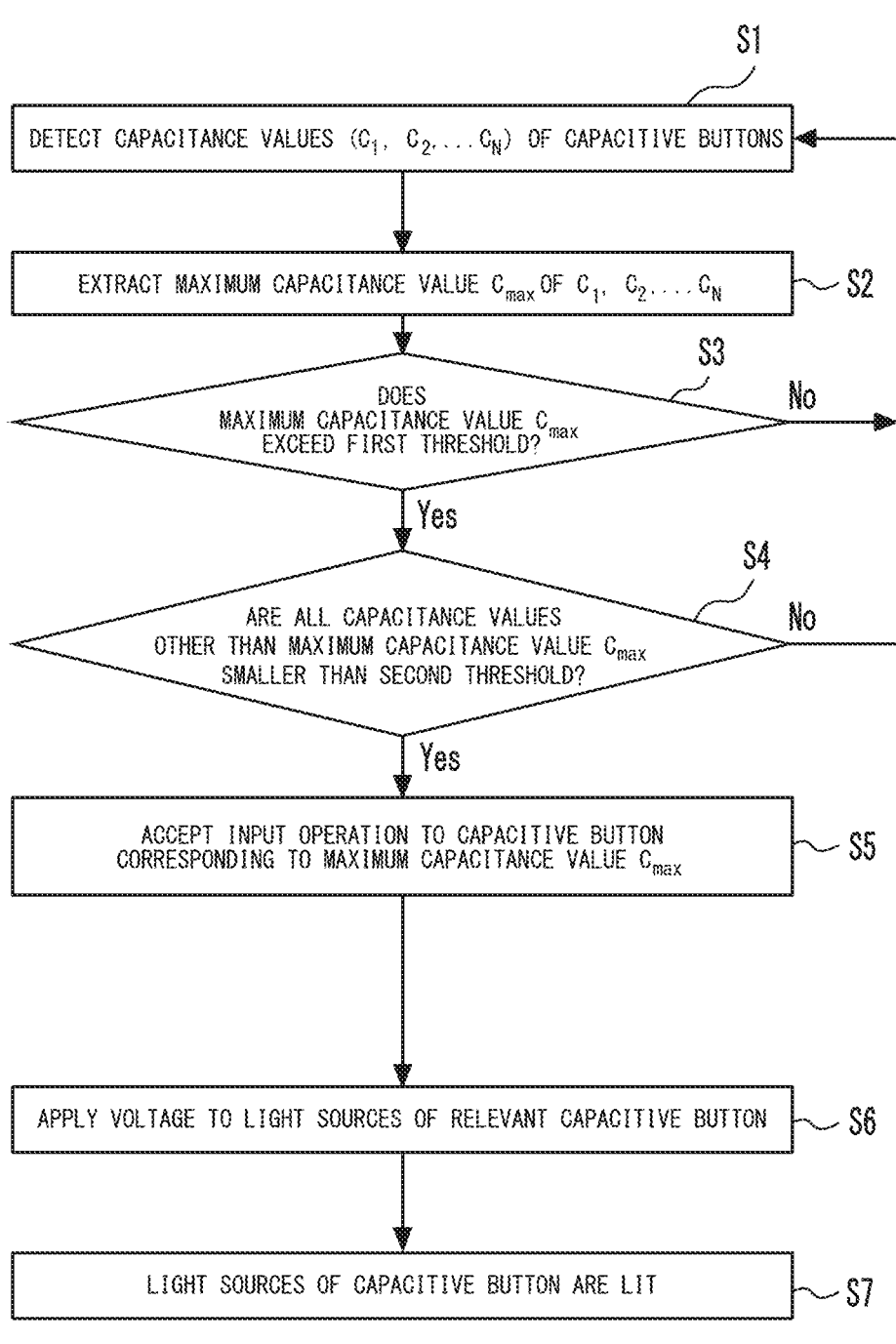
FIG. 24 is a flowchart for explaining operations of the input device in Embodiment 4.

FIG. 24 is a flowchart for explaining the operations of the input device in Embodiment 4.

In step S1, the input device detects capacitance values $(C_1, C_2, \ldots C_N)$ of the plurality of capacitive buttons. Thereafter, the input device performs the operation of step S2. In step S2, the input device extracts a maximum capacitance value $C_{max}$ of $C_1, C_2, \ldots C_N$. Thereafter, the input device performs the operation of step S3. In step S3, the input device determines whether or not the maximum capacitance value $C_{max}$ exceeds the first threshold.

In the case where the maximum capacitance value $C_{max}$ does not exceed the first threshold in step S3, the input device performs the operation of step S1. In the case where the maximum capacitance value $C_{max}$ exceeds the first threshold in step S3, the input device performs the operation of step S4. In step S4, the input device determines whether or not all the capacitance values other than the maximum capacitance value $C_{max}$ are smaller than the second threshold.

In the case where one of the capacitance values other than the maximum capacitance value $C_{max}$ is not smaller than the second threshold in step S4, the input device performs the operation of step S1. In the case where all the capacitance values other than the maximum capacitance value $C_{max}$ are smaller than the second threshold in step S4, the input device performs the operation of step S5.

In step S5, the input device accepts the input operation to the capacitive button corresponding to the maximum capacitance value $C_{max}$. Thereafter, the input device performs the operation of step S6. In step S6, the input device applies a voltage to the light sources 7 of the capacitive button. Thereafter, the input device performs the operation of step S7. In step S7, the light sources 7 of the capacitive button are lit.

According to Embodiment 4 explained above, in the case where the capacitance value detected by the capacitance detection circuit 17 in the second button adjacent to the first button is smaller than the second threshold, the input determination circuit 18 accepts the input operation to the first button. For example, in the case where the capacitance value detected by the capacitance detection circuit 17 in the second button is equal to or larger than the second threshold, the input determination circuit 18 does not accept the input operation to the first button. Therefore, erroneous input of the capacitive button can be suppressed. In particular, when the input device is applied to a destination floor registration device of an elevator, erroneous registration of a destination floor can be suppressed.

Next, an example of the input device will be explained using FIG. 25.

Figure 25:
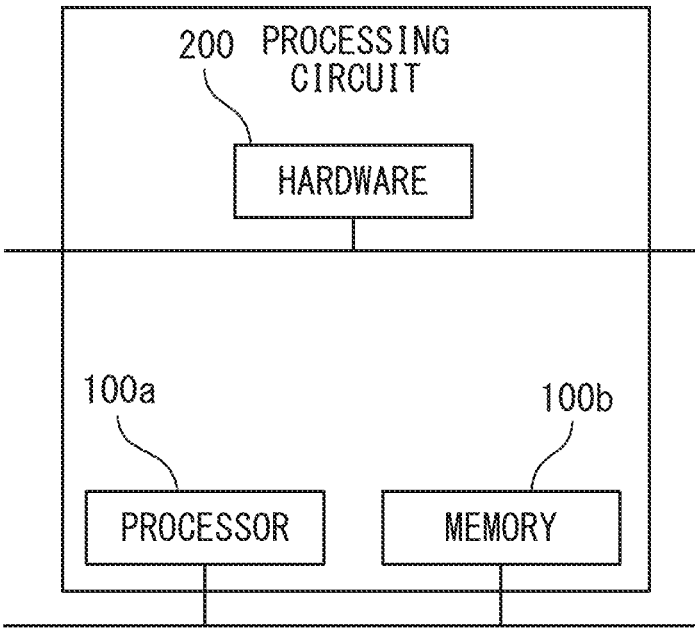
FIG. 25 is a hardware configuration diagram of the input device in Embodiment 4.

FIG. 25 is a hardware configuration diagram of the input device in Embodiment 4.

Individual functions of the input device can be realized by a processing circuit. For example, the processing circuit includes at least one processor 100*a* and at least one memory

100*b*. For example, the processing circuit includes at least one piece of exclusive hardware 200.

In the case where the processing circuit includes the at least one processor 100*a* and the at least one memory 100*b*, the individual functions of the input device are realized by software, firmware or a combination of the software and the firmware. At least one of the software and the firmware is described as a program. At least one of the software and the firmware is stored in the at least one memory 100*b*. The at least one processor 100*a* realizes the individual functions of the input device by reading and executing the program stored in the at least one memory 100*b*. The at least one processor 100*a* is also referred to as a central processing unit, a processing device, an arithmetic device, a microprocessor, a microcomputer or a DSP. For example, the at least one memory 100*b* is a nonvolatile or volatile semiconductor memory such as a RAM, a ROM, a flash memory, an EPROM and an EEPROM, a magnetic disk, a flexible disk, an optical disk, a compact disk, a mini disk and a DVD or the like.

In the case where the processing circuit includes at least one piece of exclusive hardware 200, the processing circuit is realized by, for example, a single circuit, a composite circuit, a programmed processor, a parallel programmed processor, an ASIC, an FPGA, or the combination thereof. For example, the individual functions of the input device are each realized in the processing circuit. For example, the individual functions of the input device are realized altogether in the processing circuit.

For the individual functions of the input device, some may be realized by the exclusive hardware 200 and the rest may be realized by the software or the firmware. For example, the function of the input determination circuit 18 may be realized in the processing circuit as the exclusive hardware 200, and the functions other than the function of the input determination circuit 18 may be realized by the at least one processor 100*a* reading and executing the program stored in the at least one memory 100*b*.

In this way, the processing circuit realizes the individual functions of the input device by the hardware 200, the software, the firmware, or the combination thereof.

Embodiment 5

Figure 27:
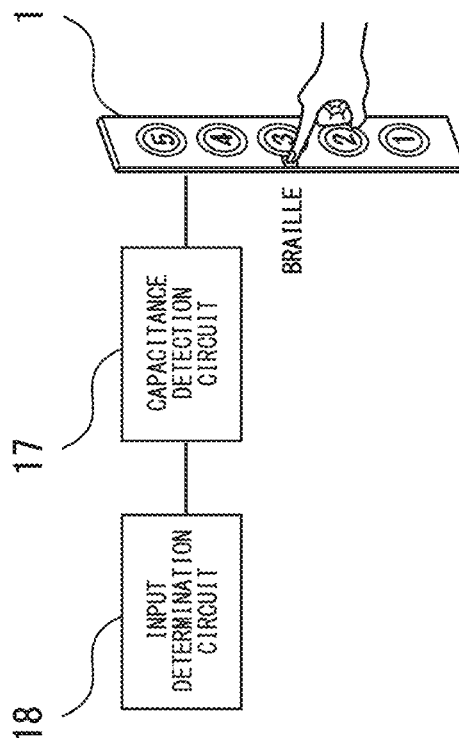
FIG. 27 is a diagram for explaining a condition for not accepting an input by the input device in Embodiment 5.

FIG. 26 is a diagram for explaining the condition for accepting the input by the input device in Embodiment 5. FIG. 27 is a diagram for explaining the condition for not accepting the input by the input device in Embodiment 5. Note that the same signs are attached to the parts same as or corresponding to the parts of Embodiment 4. The explanation of the parts is omitted.

In Embodiment 5, when the capacitance value detected by the capacitance detection circuit 17 in the first button of the plurality of capacitive buttons exceeds the first threshold, the input determination circuit 18 determines whether or not to accept the input operation to the first button. For example, in the case where the capacitance value detected by the capacitance detection circuit 17 in the second button adjacent to the first button is smaller than a second threshold and is equal to or larger than a third threshold, the input determination circuit 18 accepts the input operation to the first button. For example, in the case where the capacitance value detected by the capacitance detection circuit 17 in the second button is smaller than the third threshold, the input determination circuit 18 does not accept the input operation to the first button.

Specifically, in FIG. 26, the input determination circuit 18 accepts the input operation to the capacitive button corresponding to "third floor". In FIG. 27, the input determination circuit 18 does not accept the input operation to the capacitive button corresponding to "third floor". In addition, as shown in FIG. 27, the case of performing the operation of Braille or the operation of the button by a click or the like is assumed, and the input operation to the capacitive button is not accepted in the case of greatly exceeding the first threshold.

Next, the operations of the input device will be explained using FIG. 28.

Figure 28:
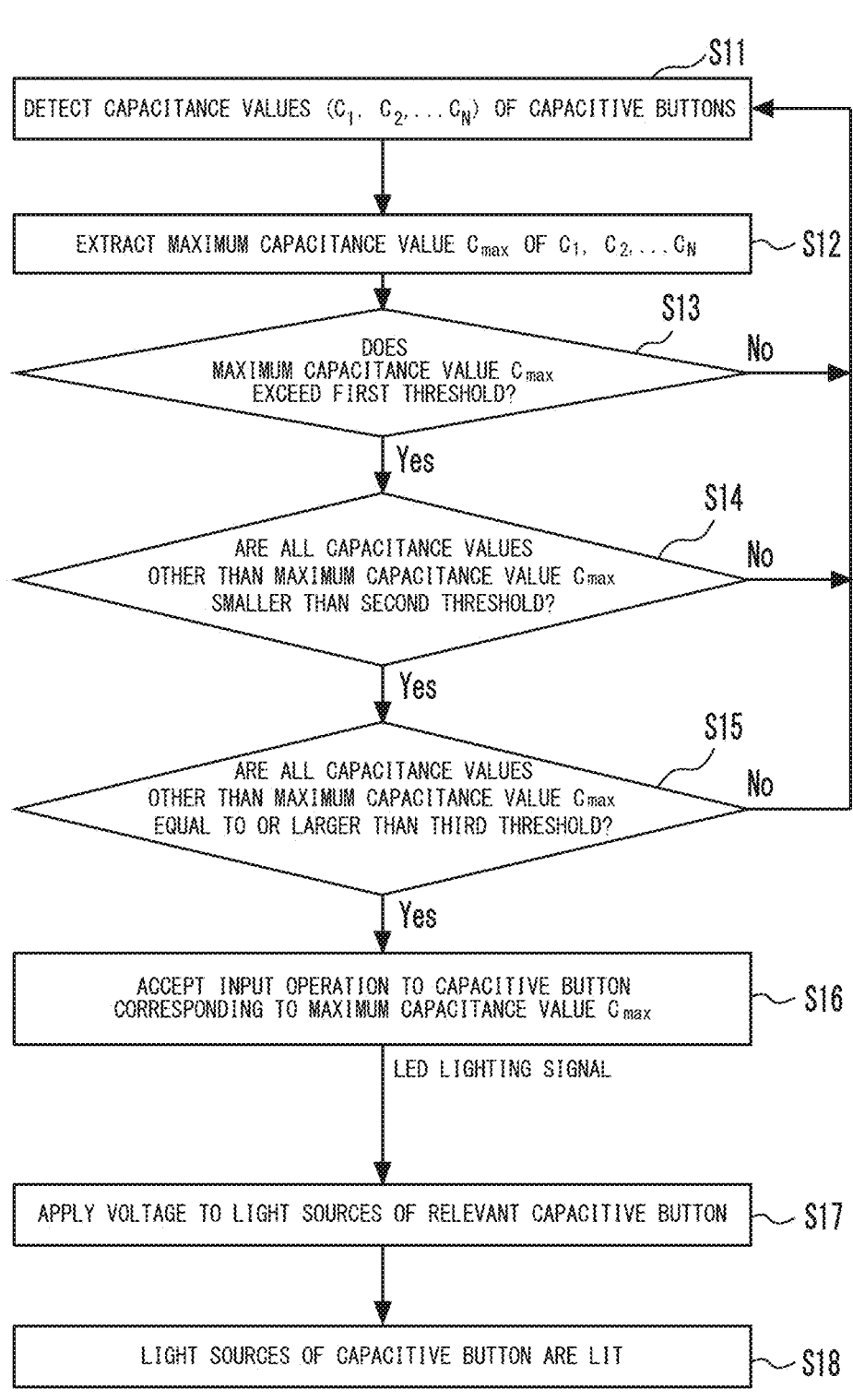
FIG. 28 is a flowchart for explaining operations of the input device in Embodiment 5.

FIG. 28 is a flowchart for explaining the operations of the input device in Embodiment 5.

In step S11, the input device detects the capacitance values ($C_1$, $C_2$, ... $C_N$) of the plurality of capacitive buttons. Thereafter, the input device performs the operation of step S12. In step S12, the input device extracts the maximum capacitance value $C_{max}$ of $C_1$, $C_2$, ... $C_N$. Thereafter, the input device performs the operation of step S13. In step S13, the input device determines whether or not the maximum capacitance value $C_{max}$ exceeds the first threshold.

In the case where the maximum capacitance value $C_{max}$ does not exceed the first threshold in step S13, the input device performs the operation of step S11. In the case where the maximum capacitance value $C_{max}$ exceeds the first threshold in step S13, the input device performs the operation of step S14. In step S14, the input device determines whether or not all the capacitance values other than the maximum capacitance value $C_{max}$ are smaller than the second threshold.

In the case where one of the capacitance values other than the maximum capacitance value $C_{max}$ is not smaller than the second threshold in step S14, the input device performs the operation of step S11. In the case where all the capacitance values other than the maximum capacitance value $C_{max}$ are smaller than the second threshold in step S14, the input device performs the operation of step S15.

In step S15, the input device determines whether or not all the capacitance values other than the maximum capacitance value $C_{max}$ are equal to or larger than the third threshold.

In the case where one of the capacitance values other than the maximum capacitance value $C_{max}$ is not equal to or larger than the third threshold in step S15, the input device performs the operation of step S11. In the case where all the capacitance values other than the maximum capacitance value $C_{max}$ are equal to or larger than the third threshold in step S15, the input device performs the operation of step S16.

In step S16, the input device accepts the input operation to the capacitive button corresponding to the maximum capacitance value $C_{max}$. Thereafter, the input device performs the operation of step S17. In step S17, the input device applies the voltage to the light sources 7 of the capacitive button. Thereafter, the input device performs the operation of step S18. In step S18, the light sources 7 of the capacitive button are lit.

According to Embodiment 5 explained above, in the case where the capacitance value detected by the capacitance detection circuit 17 in the second button adjacent to the first button is smaller than the second threshold and is equal to or larger than the third threshold, the input determination circuit 18 accepts the input operation to the first button. In the case where the capacitance value detected by the capacitance detection circuit 17 in the second button is smaller than the third threshold, the input determination circuit 18 does not accept the input operation to the first button. Therefore, the erroneous input of the capacitive button can be more surely suppressed.

Embodiment 6

Figure 29:
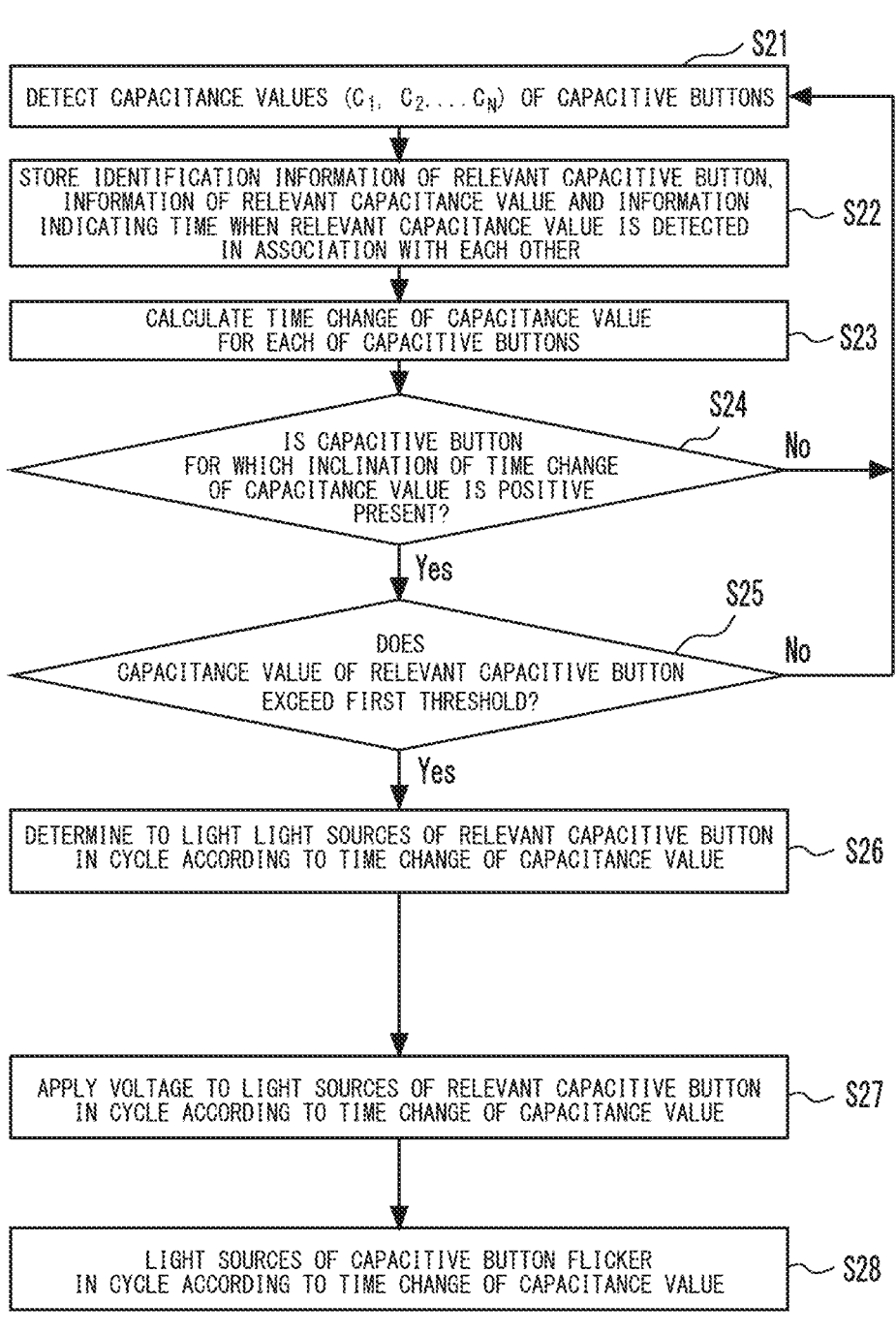
FIG. 29 is a flowchart for explaining operations of an input device in Embodiment 6.

FIG. 29 is a flowchart for explaining the operations of the input device in Embodiment 6. Note that the same signs are attached to the parts same as or corresponding to the parts of Embodiment 4. The explanation of the parts is omitted.

Though not illustrated, the input determination circuit 18 functions also as a capacitance storage circuit.

In step S21, the input device detects the capacitance values ($C_1$, $C_2$, ... $C_N$) of the plurality of capacitive buttons. Thereafter, the input device performs the operation of step S22. In step S22, the input device stores, by the function of the capacitance storage circuit, identification information of the capacitive button, information of the capacitance value, and information indicating time when the capacitance value is detected in association with each other. Thereafter, the operation of step S23 is performed. In step S23, the input device calculates a time change of the capacitance value for each of the plurality of capacitive buttons.

Thereafter, the input device performs the operation of step S24. In step S24, the input device determines whether or not the capacitive button for which an inclination of the time change of the capacitance value is positive is present. In the case where the capacitive button for which the inclination of the time change of the capacitance value is positive is not present in step S24, the input device performs the operation of step S21. In the case where the capacitive button for which the inclination of the time change of the capacitance value is positive is present in step S24, the input device performs the operation of step S25.

In step S25, the input device determines whether or not the capacitance value of the capacitive button exceeds the first threshold. In the case where the capacitance value of the capacitive button does not exceed the first threshold in step S25, the input device performs the operation of step S21. In the case where the capacitance value of the capacitive button exceeds the first threshold in step S25, the input device performs the operation of step S26.

In step S26, the input device determines to light the light sources 7 of the capacitive button in a cycle according to the time change of the capacitance value. Thereafter, the input device performs the operation of step S27. In step S27, the input device applies the voltage to the light sources 7 of the capacitive button in the cycle according to the time change of the capacitance value. Thereafter, the input device performs the operation of step S28. In step S28, the light sources 7 of the capacitive button flicker in the cycle according to the time change of the capacitance value.

According to Embodiment 6 explained above, the input device stores the identification information of the capacitive button, the information of the capacitance value, and the information indicating the time when the capacitance value is detected in association with each other. Therefore, flexible control of the input device such as flickering of the light sources 7 according to the time change of the capacitance value is made possible.

Embodiment 7

Figure 30:
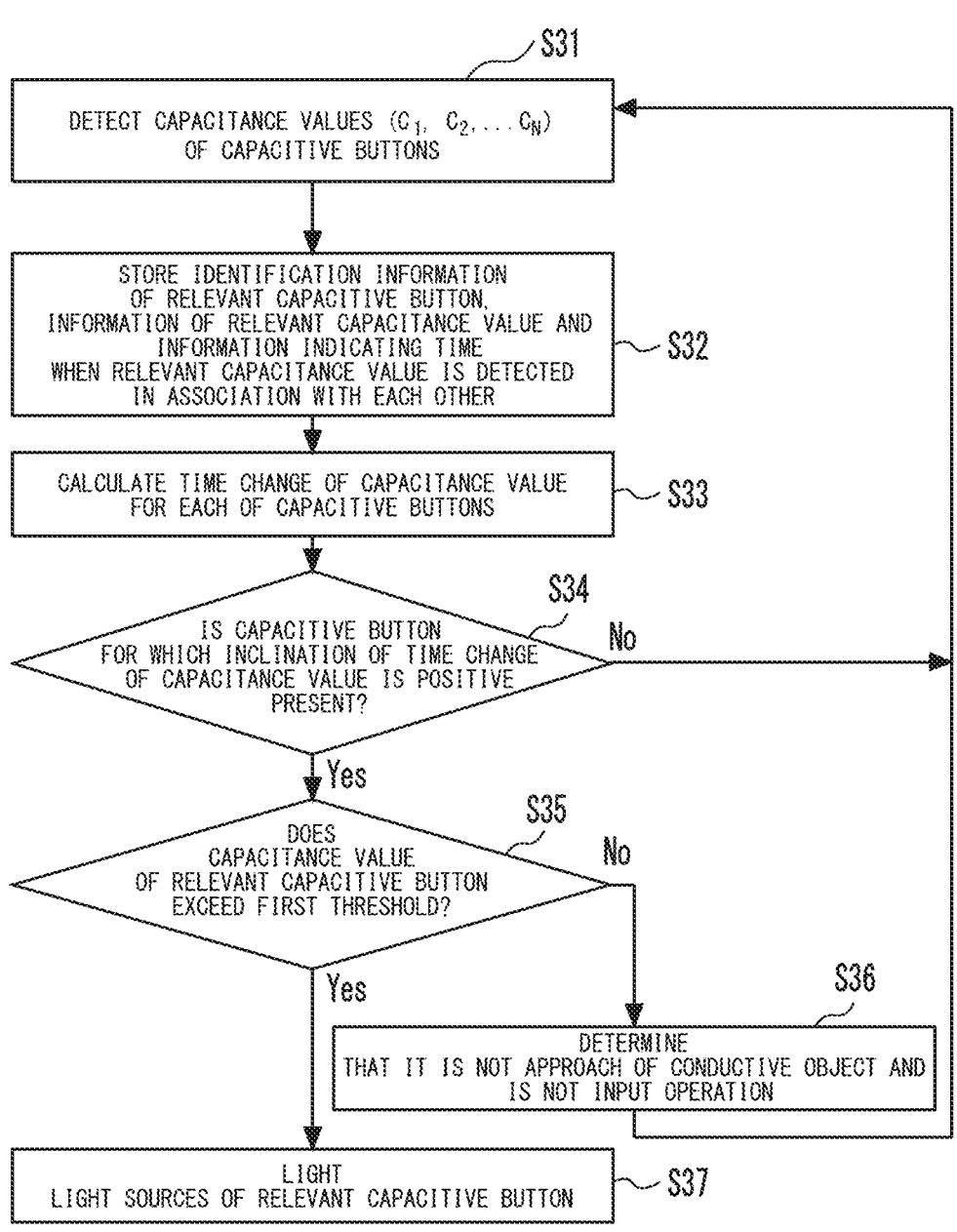
FIG. 30 is a flowchart for explaining operations of an input device in Embodiment 7.

FIG. 30 is a flowchart for explaining the operations of the input device in Embodiment 7. Note that the same signs are attached to the parts same as or corresponding to the parts of Embodiment 6. The explanation of the parts is omitted.

In step S31, the input device detects the capacitance values $(C_1, C_2, \ldots C_N)$ of the plurality of capacitive buttons. Thereafter, the input device performs the operation of step S32. In step S32, the input device stores the identification information of the capacitive button, the information of the capacitance value, and the information indicating the time when the capacitance value is detected in association with each other. Thereafter, the operation of step S33 is performed. In step S33, the input device calculates the time change of the capacitance value for each of the plurality of capacitive buttons.

Thereafter, the input device performs the operation of step S34. In step S34, the input device determines whether or not the capacitive button for which the inclination of the time change of the capacitance value is positive is present. In the case where the capacitive button for which the inclination of the time change of the capacitance value is positive is not present in step S34, the input device performs the operation of step S31. In the case where the capacitive button for which the inclination of the time change of the capacitance value is positive is present in step S34, the input device performs the operation of step S35.

In step S35, the input device determines whether or not the capacitance value of the capacitive button exceeds the first threshold.

In the case where the capacitance value of the capacitive button does not exceed the first threshold in step S35, the input device performs the operation of step S36. In step S36, the input device determines that it is not an approach of a conductive object and is not the input operation. Thereafter, the input device performs the operation of step S31.

In the case where the capacitance value of the capacitive button exceeds the first threshold in step S35, the input device performs the operation of step S37. In step S37, the input device determines that it is the input operation to the capacitive button. Thereafter, the input device lights the light sources 7 of the capacitive button.

According to Embodiment 7 explained above, the input device stores the identification information of the capacitive button, the information of the capacitance value, and the information indicating the time when the capacitance value is detected in association with each other. Therefore, by determining the input operation based on the time change of the capacitance value, the erroneous input of the capacitive button can be more surely suppressed.

Embodiment 8

Figure 31:
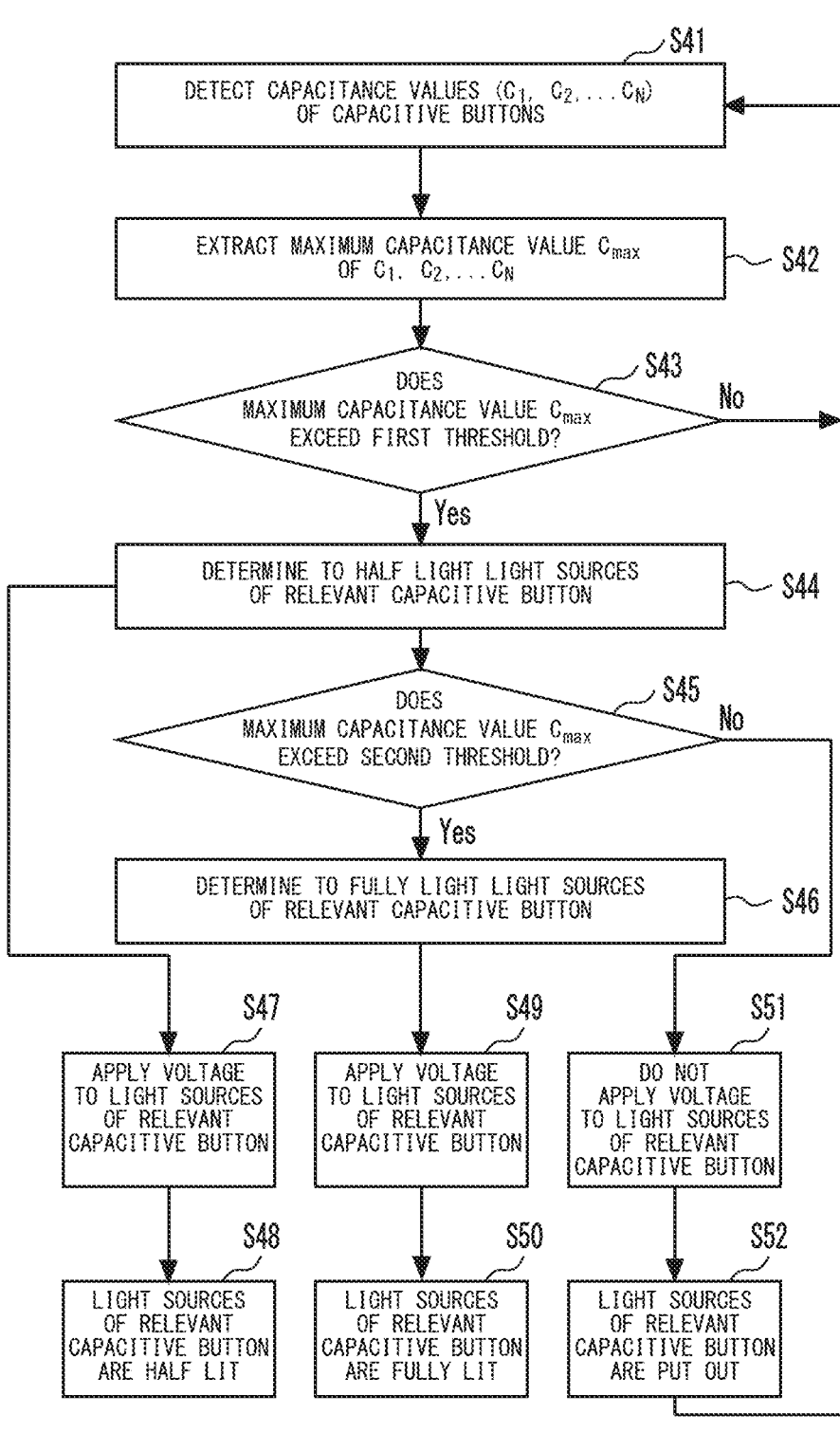
FIG. 31 is a flowchart for explaining operations of an input device in Embodiment 8.

FIG. 31 is a flowchart for explaining the operations of the input device in Embodiment 8. Note that the same signs are attached to the parts same as or corresponding to the parts of Embodiment 4. The explanation of the parts is omitted.

Though not illustrated, the input determination circuit 18 functions also as a control circuit.

In step S41, the input device detects the capacitance values $(C_1, C_2, \ldots C_N)$ of the plurality of capacitive buttons. Thereafter, the input device performs the operation of step S42. In step S42, the input device extracts the maximum capacitance value $C_{max}$ of $C_1, C_2, \ldots C_N$. Thereafter, the input device performs the operation of step S43. In step S43, the input device determines whether or not the maximum capacitance value $C_{max}$ exceeds the first threshold.

In the case where the maximum capacitance value $C_{max}$ does not exceed the first threshold in step S43, the input device performs the operation of step S41. In the case where the maximum capacitance value $C_{max}$ exceeds the first threshold in step S43, the input device performs the operation of step S44. In step S44, the input device determines to half light the light sources 7 of the capacitive button.

Thereafter, the input device performs the operation of step S45. In step S45, the input device determines whether or not the maximum capacitance value $C_{max}$ exceeds a second threshold.

In the case where the maximum capacitance value $C_{max}$ exceeds the second threshold in step S45, the input device determines to fully light the light sources 7 of the capacitive button.

In the case where the input device determines to half light the light sources 7 of the capacitive button in step S44, the input device performs the operation of step S47. In step S47, the input device applies the voltage to the light sources 7 of the capacitive button. Thereafter, the input device performs the operation of step S48. In step S48, the light sources 7 of the capacitive button are half lit.

In the case where the input device determines to fully light the light sources 7 of the capacitive button in step S46, the input device performs the operation of step S49. In step S49, the input device applies the voltage to the light sources 7 of the capacitive button. Thereafter, the input device performs the operation of step S50. In step S50, the light sources 7 of the capacitive button are fully lit.

Note that full lighting of the light sources 7 may be determined in the case where a fixed period of time elapses in a half lighting state in step S44.

In the case where the maximum capacitance value Cmax does not exceed the second threshold in step S45, the input device performs the operation of step S51. In step S51, the input device does not apply the voltage to the light sources 7 of the capacitive button. Thereafter, the input device performs the operation of step S52. In step S52, the light sources 7 of the capacitive button are put out.

According to Embodiment 8 explained above, for the light sources 7, a lighting state of the light sources 7 is changed according to the capacitance value of the capacitive button. Therefore, by highlighting an operation part, operability of the input device can be improved.

Embodiment 9

FIG. 32 is a flowchart for explaining the operations of the input device in Embodiment 9. Note that the same signs are attached to the parts same as or corresponding to the parts of Embodiment 4. The explanation of the parts is omitted.

In step S61, the input device detects the capacitance values $(C_1, C_2, \ldots C_N)$ of the plurality of capacitive buttons. Thereafter, the input device performs the operation of step S62. In step S62, the input device calculates a largest value $C_{1st}$ and a second largest value $C_{2nd}$ of $C_1, C_2, \ldots C_N$.

Thereafter, the input device performs the operation of step S63. In step S63, the input device calculates a difference $C_{1st}$-$C2_{nd}$ between the largest value $C_{1st}$ and the second largest value $C2_{nd}$. Thereafter, the input device performs the operation of step S64. In step S64, the input device determines whether or not the difference $C_{1st}$-$C2_{nd}$ exceeds a fourth threshold.

In the case where the difference $C_{1st}$-$C2_{nd}$ does not exceed the fourth threshold in step S64, the input device performs the operation of step S62. In the case where the difference $C_{1st}$-$C2_{nd}$ exceeds the fourth threshold in step S64, the input device performs the operation of step S65.

In step S65, the input device accepts the input operation to the capacitive button corresponding to the largest value Cist. Thereafter, the input device performs the operation of step S66. In step S66, the input device applies the voltage to the light sources 7 of the capacitive button. Thereafter, the input device performs the operation of step S67. In step S67, the light sources 7 of the capacitive button are lit.

According to Embodiment 9 explained above, in the case where the difference $C_{1st}$-$C2_{nd}$ between the largest value Cist and the second largest value $C2_{nd}$ of the capacitance values detected by the capacitance detection circuit 17 in the plurality of capacitive buttons is equal to or larger than the threshold, the input device accepts the input operation to the capacitive button in which the capacitance value shows the largest value $C_{1st}$. Therefore, the erroneous input of the capacitive button can be suppressed.

Note that the input operation to the capacitive button corresponding to the largest value Cist may be accepted in the case where a ratio $C_{1st}$/$C2_{nd}$ between the largest value $C_{1st}$ and the second largest value $C2_{nd}$ exceeds the threshold.

Embodiment 10

Figure 33:
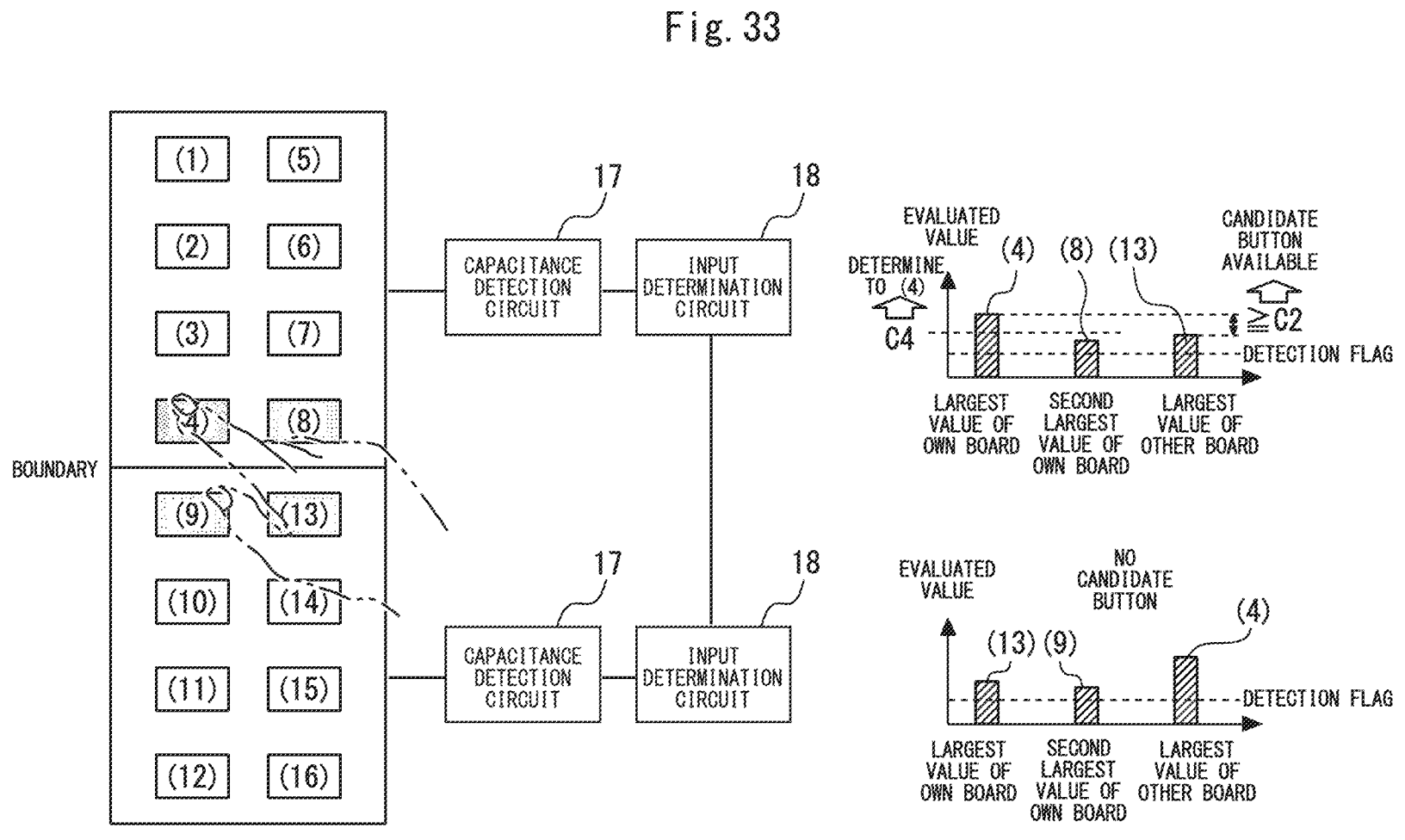

FIG. 33 is a diagram for explaining the condition for determining the input by the input device in Embodiment 10. Note that the same signs are attached to the parts same as or corresponding to the parts of Embodiment 4. The explanation of the parts is omitted.

In FIG. 33, the plurality of capacitive buttons are divided into a plurality of groups. The plurality of capacitance detection circuits 17 each detect the capacitance values of the pair of sensor electrodes 3 in the capacitive buttons in the plurality of groups. The plurality of input determination circuits 18 are each provided corresponding to the plurality of groups. The plurality of input determination circuits 18 exchange information with each other. Each of the plurality of input determination circuits 18 considers the information from the other input determination device also and determines whether or not to accept the input operation to the capacitive button.

For example, in the case where the largest value of the capacitance values detected by the capacitance detection circuit 17 in the capacitive buttons in a corresponding group is larger than the largest value of the capacitance values detected by the capacitance detection circuit 17 in the capacitive buttons in the other group and a difference or a ratio between the largest value and the second largest value of the capacitance values detected by the capacitance detection circuit 17 in the capacitive buttons in the corresponding group is equal to or larger than the fourth threshold, the input determination circuit 18 accepts the input operation to the capacitive button in which the capacitance value shows the largest value.

In FIG. 33, the input determination circuit 18 on an upper side accepts the input operation to the capacitive button corresponding to "fourth floor".

Next, the operations of the input device will be explained using FIG. 34 and FIG. 35.

Figure 34:
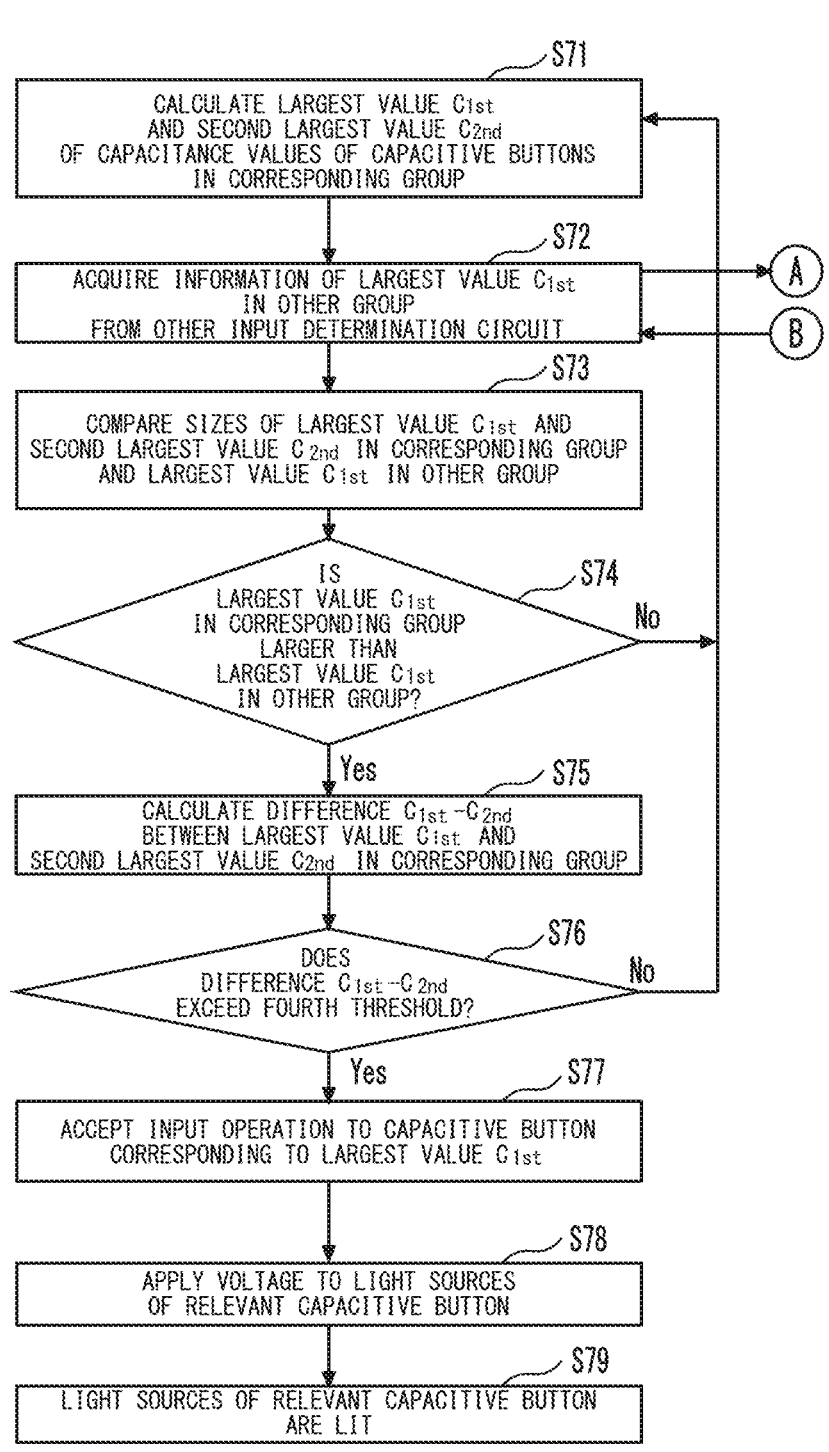
FIG. 34 is a flowchart for explaining operations of the input device in Embodiment 10.

FIG. 34 and FIG. 35 are flowcharts for explaining the operations of the input device in Embodiment 10.

In step S71, the input determination circuit 18 calculates the largest value $C_{1st}$ and the second largest value $C2_{nd}$ of the capacitance values of the capacitive buttons in the corresponding group. Thereafter, the input determination circuit 18 performs the operation of step S72. In step S72, the input determination circuit 18 acquires the information of the largest value $C_{1st}$ in the other group from the other input determination circuit 18.

Thereafter, the input determination circuit 18 performs the operation of step S73. In step S73, the input determination circuit 18 compares sizes of the largest value Cist and the second largest value $C2_{nd}$ in the corresponding group and the largest value $C_{1st}$ in the other group. Thereafter, in step S74, the input determination circuit 18 determines whether or not the largest value $C_{1st}$ in the corresponding group is larger than the largest value Cist in the other group.

In the case where the largest value Cist in the corresponding group is not larger than the largest value $C_{1st}$ in the other group in step S74, the input determination circuit 18 performs the operation of step S71. In the case where the largest value Cist in the corresponding group is larger than the largest value $C_{1st}$ in the other group in step S74, the input determination circuit 18 performs the operation of step S75.

In step S75, the input determination circuit 18 calculates the difference $C_{1st}$-$C2_{nd}$ between the largest value $C_{1st}$ and the second largest value $C2_{nd}$ in the corresponding group. Thereafter, the input device performs the operation of step S76. In step S76, the input determination circuit 18 determines whether or not the difference $C_{1st}$-$C2_{nd}$ exceeds the fourth threshold.

In the case where the difference $C_{1st}$-$C2_{nd}$ does not exceed the fourth threshold in step S76, the input determination circuit 18 performs the operation of step S71. In the case where the difference $C_{1st}$-$C2_{nd}$ exceeds the fourth threshold in step S76, the input device performs the operation of step S77.

In step S77, the input determination circuit 18 accepts the input operation to the capacitive button corresponding to the largest value Cist. Thereafter, the input determination circuit 18 performs the operation of step S78. In step S78, the input determination circuit 18 applies the voltage to the light sources 7 of the capacitive button. Thereafter, the input determination circuit 18 performs the operation of step S79. In step S79, the light sources 7 of the capacitive button are lit.

According to Embodiment 10 explained above, in the case where the largest value of the capacitance values detected by the capacitance detection circuit 17 in the capacitive buttons in the corresponding group is larger than the largest value of the capacitance values detected by the capacitance detection circuit 17 in the capacitive buttons in the other group and the difference or the ratio between the largest value and the second largest value of the capacitance values detected by the capacitance detection circuit 17 in the capacitive buttons in the corresponding group is equal to or larger than the fourth threshold, the input determination circuit 18 accepts the input operation to the capacitive button in which the capacitance value shows the largest value. Therefore, a degree of freedom in layout of the input device can be improved while suppressing the erroneous input of the capacitive button.

Embodiment 11

Figure 36:
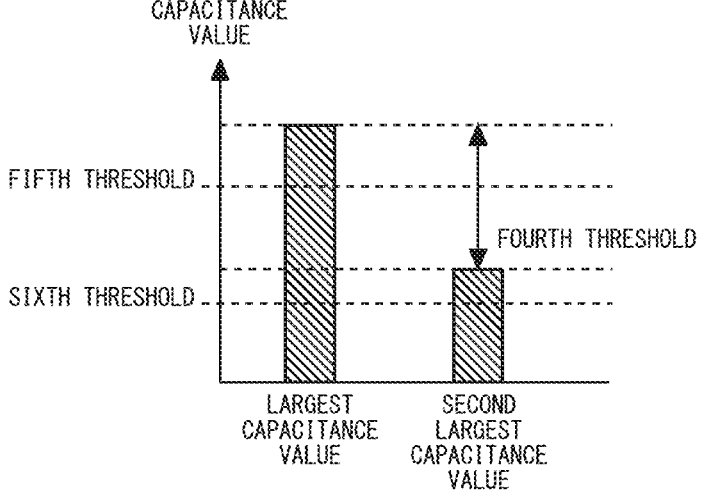
FIG. 36 is a diagram for explaining a condition for determining an input by an input device in Embodiment 11.

FIG. 36 is a diagram for explaining the condition for determining the input by the input device in Embodiment 11. Note that the same signs are attached to the parts same as or corresponding to the parts of Embodiment 4. The explanation of the parts is omitted.

As illustrated in FIG. 36, in the case where the capacitance value of the capacitive button for which the input operation is accepted becomes equal to or larger than a fifth threshold, the input determination circuit 18 determines the input of the capacitive button. In the case where the capacitance value of the capacitive button for which the input operation is accepted becomes equal to or smaller than a sixth threshold, the input determination circuit 18 cancels acceptance of the input of the capacitive button.

Next, the operations of the input device will be explained using FIG. 37.

Figure 37:
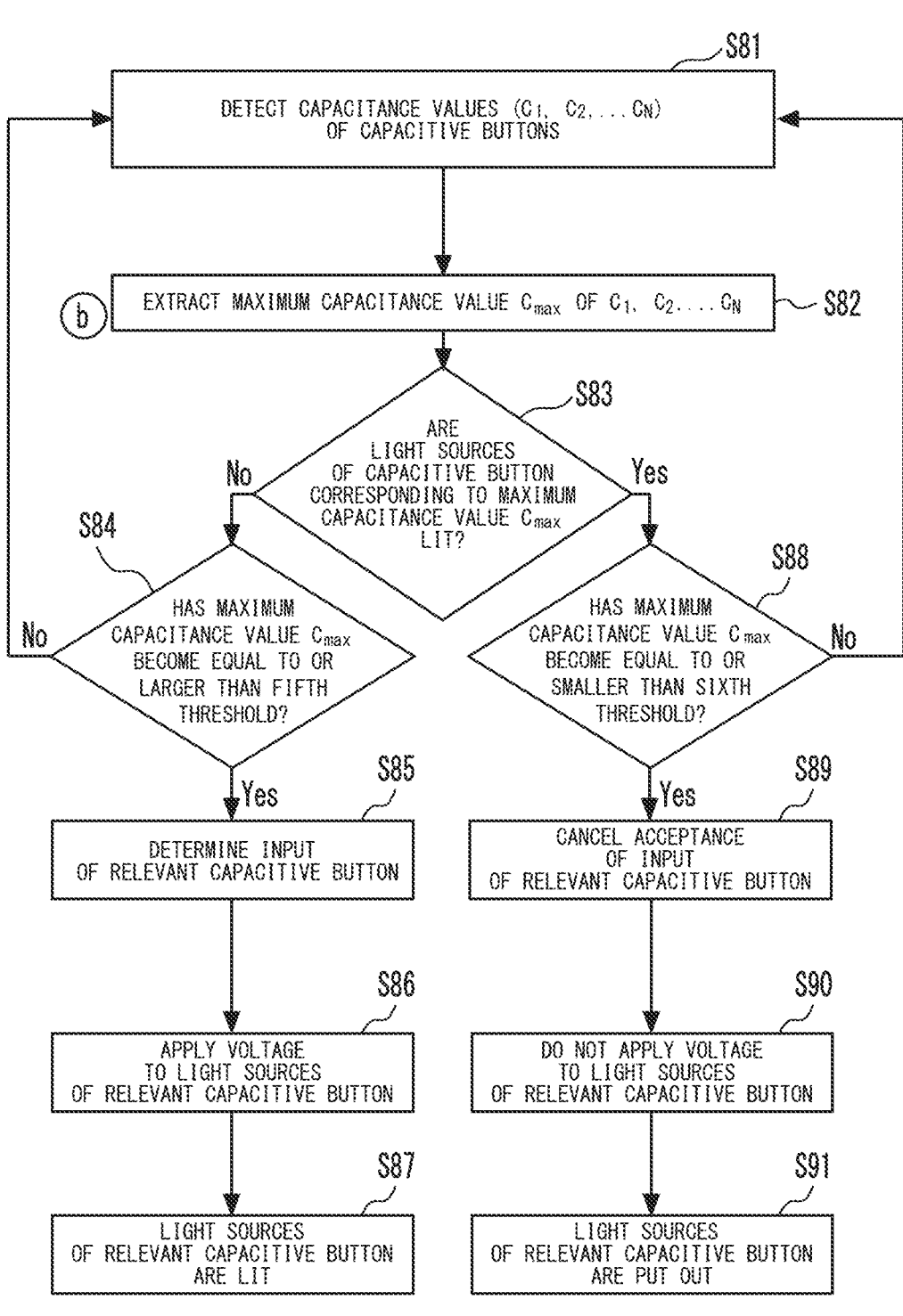
FIG. 37 is a flowchart for explaining operations of the input device in Embodiment 11.

FIG. 37 is a flowchart for explaining the operations of the input device in Embodiment 11.

In step S81, the input device detects the capacitance values ($C_1$, $C_2$, . . . $C_N$) of the plurality of capacitive buttons. Thereafter, the input device performs the operation of step S82. In step S82, the input device extracts the maximum capacitance value $C_{max}$ of $C_1$, $C_2$, . . . $C_N$. Thereafter, the input device performs the operation of step S83. In step S83, the input device determines whether or not the light sources 7 of the capacitive button corresponding to the maximum capacitance value $C_{max}$ are lit.

In the case where the light sources 7 of the capacitive button corresponding to the maximum capacitance value $C_{max}$ are not lit in step S83, the input device performs the operation of step S84. In step S84, the input device determines whether or not the maximum capacitance value $C_{max}$ has become equal to or larger than the fifth threshold.

In the case where the maximum capacitance value $C_{max}$ has not become equal to or larger than the fifth threshold in step S84, the input device performs the operation of step S81. In the case where the maximum capacitance value $C_{max}$ has become equal to or larger than the fifth threshold in step S84, the input device performs the operation of step S85.

In step S85, the input device determines the input of the capacitive button. Thereafter, the input device performs the operation of step S86. In step S86, the input device applies the voltage to the light sources 7 of the capacitive button. Thereafter, the input device performs the operation of step S87. In step S87, the light sources 7 of the capacitive button are lit.

In the case where the light sources 7 of the capacitive button corresponding to the maximum capacitance value $C_{max}$ are lit in step S83, the input device performs the operation of step S88. In step S88, the input device determines whether or not the maximum capacitance value $C_{max}$ has become equal to or smaller than the sixth threshold.

In the case where the maximum capacitance value $C_{max}$ has not become equal to or smaller than the sixth threshold in step S88, the input device performs the operation of step S81. In the case where the maximum capacitance value $C_{max}$ has become equal to or smaller than the sixth threshold in step S88, the input device performs the operation of step S89.

In step S89, the input device cancels the acceptance of the input of the capacitive Thereafter, the input device performs the operation of step S90. In step S90, button. the input device does not apply the voltage to the light sources 7 of the capacitive button. Thereafter, the input device performs the operation of step S91. In step S91, the light sources 7 of the capacitive button are put out.

According to Embodiment 11 explained above, in the case where the capacitance value of the capacitive button for which the input operation is accepted becomes equal to or larger than the fifth threshold, the input determination circuit 18 determines the input of the capacitive button. In the case where the capacitance value of the capacitive button for which the input operation is accepted becomes equal to or smaller than the sixth threshold, the input determination circuit 18 cancels the acceptance of the input of the capacitive button. Therefore, the erroneous input of the capacitive button can be more surely suppressed.

Embodiment 12

Figure 38:
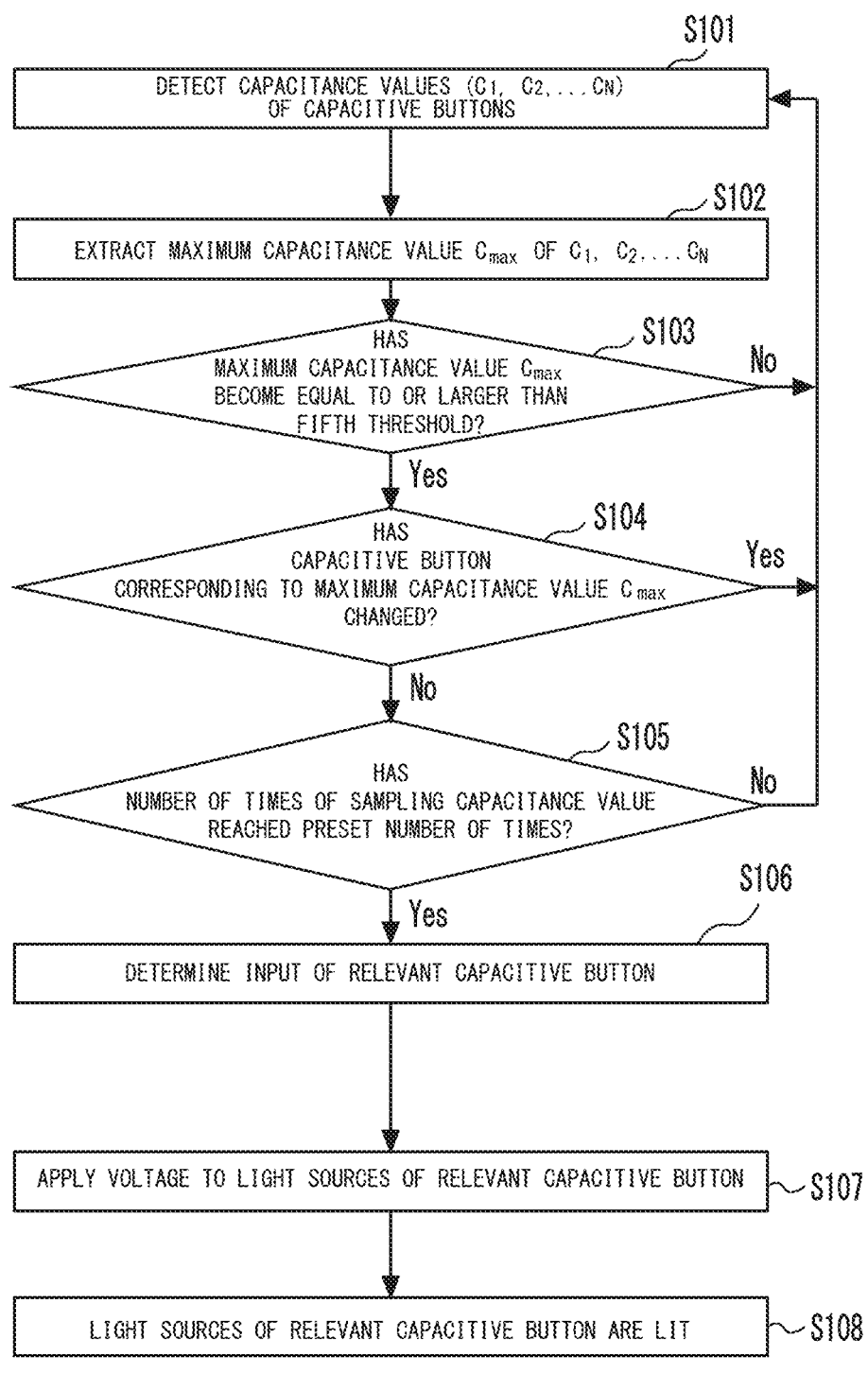
FIG. 38 is a flowchart for explaining operations of an input device in Embodiment 12.

FIG. 38 is a flowchart for explaining the operations of the input device in Embodiment 12. Note that the same signs are attached to the parts same as or corresponding to the parts of Embodiment 4. The explanation of the parts is omitted.

In step S101, the input device detects the capacitance values ($C_1$, $C_2$, . . . $C_N$) of the plurality of capacitive buttons. Thereafter, the input device performs the operation of step S102. In step S102, the input device extracts the maximum capacitance value $C_{max}$ of $C_1$, $C_2$, . . . $C_N$. Thereafter, the input device performs the operation of step S103. In step S103, the input device determines whether or not the maximum capacitance value $C_{max}$ has become equal to or larger than the fifth threshold.

In the case where the maximum capacitance value $C_{max}$ has not become equal to or larger than the fifth threshold in step S103, the input device performs the operation of step S101. In the case where the maximum capacitance value $C_{max}$ has become equal to or larger than the fifth threshold in step S103, the input device performs the operation of step S104.

In step S104, the input device determines whether or not the capacitive button corresponding to the maximum capacitance value $C_{max}$ has changed. In the case where the capacitive button corresponding to the maximum capacitance value $C_{max}$ has changed in step S104, the input device performs the operation of step S101. In the case where the capacitive button corresponding to the maximum capacitance value $C_{max}$ has not changed in step S104, the input device performs the operation of step S105.

In step S105, the input device determines whether or not the number of times of sampling the capacitance value has reached a preset number of times. In the case where the number of times of sampling the capacitance value has not reached the preset number of times in step S105, the input device performs the operation of step S101. In the case where the number of times of sampling the capacitance value has reached the preset number of times in step S105, the input device performs the operation of step S106.

In step S106, the input device determines the input of the capacitive button. Thereafter, the input device performs the operation of step S107. In step S107, the input device applies the voltage to the light sources 7 of the capacitive button. Thereafter, the input device performs the operation of step S108. In step S108, the light sources 7 of the capacitive button are lit.

According to Embodiment 12 explained above, the input of the capacitive button is determined in the case where the capacitance value of the capacitive button for which the input operation is accepted continuously becomes equal to or larger than the fifth threshold. Therefore, the erroneous input of the capacitive button can be more surely suppressed.

INDUSTRIAL APPLICABILITY

As described above, the capacitive button of the present disclosure can be utilized in a destination floor registration device of an elevator.

REFERENCE SIGNS LIST

1 Button holding plate, 2 Insulator, 2a Hole, 3 Sensor electrode, 4 Floating electrode, 5 Ground electrode, 6 Casing, 7 Light source, 8 Spring, 9 Tactile switch, 10 Antenna electrode, 11 Microcomputer, 12 Regulator, 13 Regulated power supply, 14 Capacitor, 15 Bypass capacitor, 16 Operation accepting body, 17 Capacitance detection circuit, 18 Input determination circuit, 100a Processor, 100b Memory, 200 Hardware.

The invention claimed is:

1. A capacitive button comprising:

a pair of sensor electrodes which are provided side by side;

a floating electrode which is arranged on a front side of the pair of sensor electrodes via an insulating layer; and a ground electrode which is arranged so as to surround the floating electrode and is grounded without being electrically connected with the pair of sensor electrodes and the floating electrode, wherein capacitances of the pair of sensor electrodes are detected by a mutual capacitance system each as an excitation electrode and a detection electrode, and the capacitive button further comprising:

a holding body which holds the pair of sensor electrodes and the floating electrode from a back side; and a tactile switch which is provided on the back side of the holding body, and is pressed when the holding body is moved from the front side to the back side.

2. The capacitive button according to claim 1, wherein the pair of sensor electrodes are each divided and capacitance between the pair of sensor electrodes and the floating electrode is the same.

3. The capacitive button according to claim 1, wherein the floating electrode has an area corresponding to an area of the pair of sensor electrodes.

4. The capacitive button according to claim 1, wherein the pair of sensor electrodes are connected to a circuit to which a microcomputer, a regulator and a regulated power supply are connected, via a resistor and a suppressor, and are set such that a characteristic impedance is electrically uniform with the microcomputer, the regulator and the regulated power supply.

5. The capacitive button according to claim 1, wherein the pair of sensor electrodes are connected to a circuit to which a microcomputer, a regulator and a regulated power supply are connected in a state where a power terminal of the microcomputer is connected via a bypass capacitor in the circuit, and are set such that a characteristic impedance is electrically uniform with the microcomputer, the regulator and the regulated power supply.

6. A capacitive button comprising:

a pair of sensor electrodes which are provided side by side;

a floating electrode which is arranged on a front side of the pair of sensor electrodes via an insulating layer; and a ground electrode which is arranged so as to surround the floating electrode and is grounded without being electrically connected with the pair of sensor electrodes and the floating electrode, wherein capacitances of the pair of sensor electrodes are detected by a mutual capacitance system each as an excitation electrode and a detection electrode, and the capacitive button further comprising an antenna electrode which is provided side by side with the pair of sensor electrodes in a state of forming a gap with the floating electrode more on a back side than the floating electrode, and is grounded.

7. The capacitive button according to claim 6, wherein the pair of sensor electrodes are each divided and capacitance between the pair of sensor electrodes and the floating electrode is the same.

8. The capacitive button according to claim 6, wherein the floating electrode has an area corresponding to an area of the pair of sensor electrodes.

9. The capacitive button according to claim 6, wherein the pair of sensor electrodes are connected to a circuit to which a microcomputer, a regulator and a regulated power supply are connected, via a resistor and a suppressor, and are set such that a characteristic impedance is electrically uniform with the microcomputer, the regulator and the regulated power supply.

10. The capacitive button according to claim 6, wherein the pair of sensor electrodes are connected to a circuit to which a microcomputer, a regulator and a regulated power supply are connected in a state where a power terminal of the microcomputer is connected via a bypass capacitor in the circuit, and are set such that a characteristic impedance is electrically uniform with the microcomputer, the regulator and the regulated power supply.

* * * * *